United States Patent
Park et al.

(10) Patent No.: US 9,613,697 B2
(45) Date of Patent: Apr. 4, 2017

(54) RESISTIVE MEMORY DEVICE

(71) Applicant: SAMSUNG ELECTRONICS CO., LTD., Suwon-si, Gyeonggi-do (KR)

(72) Inventors: Hyun-Kook Park, Anyang-si (KR); Yeong-Taek Lee, Seoul (KR); Dae-Seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/151,661

(22) Filed: May 11, 2016

(65) Prior Publication Data
US 2017/0032838 A1 Feb. 2, 2017

(30) Foreign Application Priority Data
Jul. 31, 2015 (KR) .................. 10-2015-0108866

(51) Int. Cl.
*G11C 11/00* (2006.01)
*G11C 13/00* (2006.01)

(52) U.S. Cl.
CPC .. *G11C 13/0069* (2013.01); *G11C 2013/0078* (2013.01)

(58) Field of Classification Search
USPC ..... 365/148, 189.16, 189.06, 189.09, 230.06
See application file for complete search history.

(56) References Cited

U.S. PATENT DOCUMENTS

| | | |
|---|---|---|
| 7,440,316 B1 | 10/2008 | Lee et al. |
| 7,936,586 B2 | 5/2011 | Hosono et al. |
| 8,194,434 B2 | 6/2012 | Toda |
| 8,243,508 B2 | 8/2012 | Choi |
| 8,456,887 B2 | 6/2013 | Iwata |
| 8,520,423 B2 | 8/2013 | Lee et al. |
| 8,531,892 B2 | 9/2013 | Yoon |
| 8,699,262 B2 | 4/2014 | Watanabe et al. |
| 8,902,636 B2 | 12/2014 | Katayama |
| 8,917,534 B2 | 12/2014 | Castro |
| 2013/0301335 A1* | 11/2013 | Ong .................. G11C 29/06 365/148 |
| 2016/0125942 A1* | 5/2016 | Yoon ............... G11C 13/0069 365/148 |

OTHER PUBLICATIONS

Daniele Ielmini et al., "Recovery and Drift Dynamics of Resistance and Threshold Voltages in Phase-Change Memories," IEEE Transactions on Electron Devices, vol. 54 No. 2, Feb. 2007, pp. 308-315.

* cited by examiner

*Primary Examiner* — Vu Le
(74) *Attorney, Agent, or Firm* — Volentine & Whitt, PLLC

(57) ABSTRACT

A resistive memory device includes a memory cell array having a plurality of memory cells respectively connected to a plurality of first signal lines and a plurality of second signal lines crossing each other. A first write driver is configured to provide a write voltage to write data to the memory cells. A second write driver is configured to be disposed between the memory cell array and the first write driver and provide a write current generated based on the write voltage to a first signal line selected from among the plurality of first signal lines.

20 Claims, 31 Drawing Sheets

RESISTIVE MEMORY DEVICE

CROSS-REFERENCE TO RELATED APPLICATION

This application claims the benefit of Korean Patent Application No. 10-2015-0108866, filed on Jul. 31, 2015, in the Korean Intellectual Property Office, the disclosure of which is incorporated herein in its entirety by reference.

BACKGROUND

The disclosure relates to a memory device, and more particularly, to a resistive memory device and an operating method of the resistive memory device.

According to a demand for a high capacity and low power consumption memory device, research for next-generation memory devices that are non-volatile and do not require a refresh operation is being conducted. The next-generation memory devices are required to have a high integrity characteristic of a Dynamic Random Access Memory (DRAM), a non-volatile characteristic of a flash memory, and a high speed of a static RAM (SRAM). As the next-generation memory devices, a Phase change RAM (PRAM), a Nano Floating Gate Memory (NFGM), a Polymer RAM (PoRAM), a Magnetic RAM (MRAM), a Ferroelectric RAM (FeRAM), and a Resistive RAM (RRAM) are being highlighted.

SUMMARY

The disclosure provides a resistive memory device having improved durability and improved data reliability by preventing a surge current from flowing through a memory cell.

According to an aspect of the present disclosure, there is provided a resistive memory device including: a memory cell array having a plurality of memory cells respectively connected to a plurality of first signal lines and a plurality of second signal lines crossing each other; a first write driver configured to provide a write voltage for writing data to the memory cells; and a second write driver disposed between the memory cell array and the first write driver and configured to provide a write current generated based on the write voltage to a first signal line selected from among the plurality of first signal lines.

The first write driver may provide the write voltage to the second write driver, wherein a voltage level of the write voltage changes according to the number of times a program loop is performed.

The second write driver may convert the write voltage received from the first write driver into the write current.

The second write driver may include a transistor including a drain terminal connected to the selected first signal line, a source terminal connected to the first write driver, and a gate terminal to which a control voltage is applied, wherein the transistor generates the write current based on a difference between voltages at the gate terminal and the source terminal.

The first write driver may increase or reduce the write voltage as the number of times a program loop is performed increases, and the write current may increase as the number of times of the program loop is increased.

The first write driver may be connected to a third signal line, and the second write driver may be electrically connected to the first write driver via the third signal line.

According to another aspect of the present disclosure, there is provided a resistive memory device including: a first memory cell array and a second memory cell array each including a plurality of first signal lines, a plurality of second signal lines, and a plurality of memory cells connected to the plurality of first signal lines and the plurality of second signal lines. The first memory cell array and the second memory cell array are arranged in parallel to each other. A first current driver is configured to be connected to at least one of the plurality of first signal lines of the first memory cell array; a second current driver is configured to be connected to at least one of the plurality of first signal lines of the second memory cell array; and a first voltage driver is configured to provide a first write voltage to the first current driver and the second current driver via a third signal line.

Each of the first current driver and the second current driver may generate a first write current based on the first write voltage and provide the first write current to a selected memory cell of the corresponding memory cell array via the at least one of the first signal lines.

The first current driver may be disposed adjacent to the first memory cell array, and the second current driver may be disposed adjacent to the second memory cell array.

According to another aspect of the present disclosure, there is provided a resistive memory device that includes a memory cell array having a plurality of resistive-memory cells that are addressed by first address lines and second address lines. A voltage driver generates a first write voltage, the first write voltage being applied to a selected one of the first address lines during a reset-write operation so as to program, to a higher-resistance state, a selected one of the resistive-memory cells addressed by the selected first address line. A current driver generates a write current based upon a second write voltage generated by the voltage driver, the write current being applied to the selected first address line during a set-write operation so as to program, to a lower-resistance state, the selected resistive-memory cell.

BRIEF DESCRIPTION OF THE DRAWINGS

Exemplary embodiments of the present disclosure will be more clearly understood from the following detailed description taken in conjunction with the accompanying drawings in which.

DETAILED DESCRIPTION OF THE EMBODIMENTS

Figure 1:
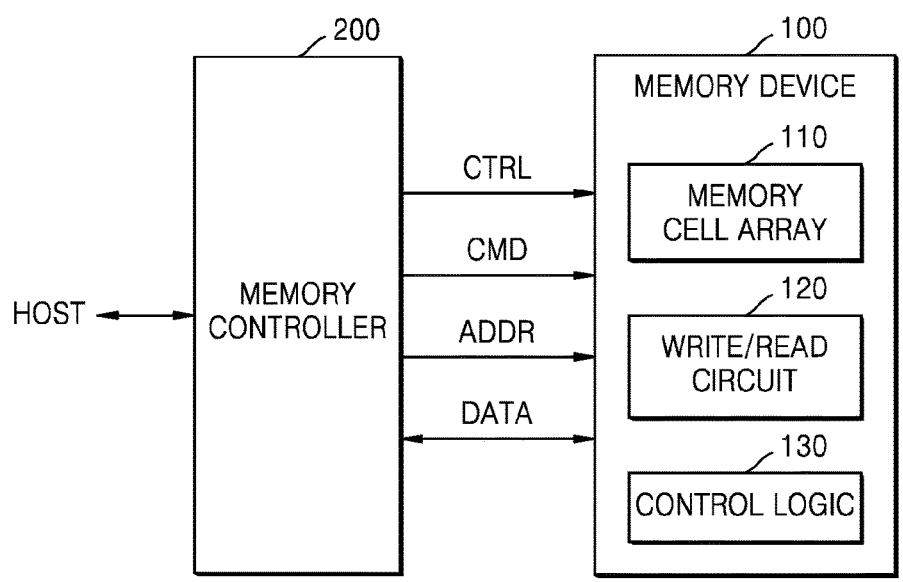
FIG. 1 is a schematic block diagram of a memory system including a resistive memory device according to an embodiment of the present disclosure.

The present disclosure will now be described more fully with reference to the accompanying drawings, in which exemplary embodiments of the present disclosure are shown. The disclosure may, however, be embodied in many different forms, and should not be construed as being limited to the embodiments set forth herein. Thus, the disclosure may include all revisions, equivalents, or substitutions which are included in the concept and the technical scope related to the present disclosure. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the disclosure.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 including a resistive memory device 100 according to an embodiment of the present disclosure.

Referring to FIG. 1, the memory system 10 may include the resistive memory device 100 (hereinafter, referred as the memory device 100) and a memory controller 200. The memory device 100 may include a memory cell array 110, a write/read circuit 120, and a control logic 130. Also, the memory device 100 may further include circuits performing write and read operations on the memory cell array 110 according to control of the control logic 130. Since the memory cell array 110 includes resistive memory cells, the memory system 10 may be called a resistive memory system.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. Also, write-target data DATA and read data DATA may be exchanged between the memory controller 200 and the memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, Advanced Technology Attachment (ATA), Serial-ATA, Parallel-ATA, SCSI, ESDI, and IDE.

The memory cell array 110 may include a plurality of memory cells (not shown) that are respectively disposed in regions where a plurality of first signal lines and a plurality of second signal lines cross each other. According to an exemplary embodiment, the plurality of first signal lines may be a plurality of bit lines, and the plurality of second signal lines may be a plurality of word lines. According to another exemplary embodiment, the plurality of first signal lines may be a plurality of word lines, and the plurality of second signal lines may be a plurality of bit lines.

In the present exemplary embodiment, each of the memory cells may be a single level cell (SLC) that stores one-bit data or a multilevel cell (MLC) that may store at least two-bit data. Alternatively, the memory cell array 110 may include both SLCs and MLCs. When one-bit data is written to one memory cell, the memory cells may have two resistance level distributions according to the written data. Alternatively, when two-bit data is written to one memory cell, the memory cells may have four resistance level distributions according to the written data. In another exemplary embodiment, if a memory cell is a TLC that stores three-bit data, the memory cells may have eight resistance level distributions according to the written data. However, one or more exemplary embodiments of the present disclosure are not limited thereto. According to another exemplary embodiment, each of the memory cells may store at least four-bit data.

Also, according to an exemplary embodiment, the memory cell array 110 may include memory cells in a two-dimensional horizontal structure. In another exemplary embodiment, the memory cell array 110 may include memory cells with a three-dimensional vertical structure.

The memory cell array 110 may include resistive memory cells that include a variable resistance device (not shown) having a variable resistor. For example, when the resistance of the variable resistance device that is formed of a phase change material (e.g., Ge—Sb—Te) changes according to temperature, a resistive memory device may be a Phase-change RAM (PRAM). As another example, when the variable resistance device is formed of complex metal oxide including an upper electrode, a lower electrode, and transition metal oxide therebetween, the resistive memory device may be a Resistive RAM (ReRAM). As another example, when the variable resistance device is formed of an upper electrode of a magnetic material, a lower electrode of a magnetic material, and a dielectric therebetween, the resistive memory device may be a Magnetic RAM (MRAM). Hereinafter, it is assumed that the memory cell array 110 is a ReRAM.

According to the exemplary embodiment of the present disclosure, the memory cell array 110 may include a plurality of cell regions. The plurality of cell regions may be defined in various ways; for example, each of the cell regions may be a page unit including a plurality of memory cells connected to the same word line. As another example, the cell region may include a plurality of memory cells that are connected to the word lines and the bit lines, and the word lines may be connected to one row decoder (or a row selection switch block), and the bit lines may be connected to one column decoder (or a column selection switch block). In addition, the cell region may be defined as a tile.

The write/read circuit 120 may perform write and read operations on the memory cells. The write/read circuit 120 is connected to the memory cells via the plurality of bit lines or the plurality of word lines, and may include a write driver for writing data in the memory cells and a sense amplifier (not shown) for amplifying data read from the memory cells.

The write/read circuit 120 may include a plurality of first write drivers and a plurality of second write drivers. Each of the plurality of first write drivers are connected to a plurality of cell regions to control a write operation on the plurality of cell regions and a plurality of second write drivers are respectively connected to the plurality of cell regions to control a write operation on corresponding cell regions. The plurality of second write drivers may be disposed adjacent to the corresponding cell regions.

The first write driver may provide a write voltage to the second write driver, and the second write driver may convert the write voltage into a write current. The second write driver may provide the write current to a memory cell. The second write driver provides the write current to a cell region from a location adjacent to the corresponding cell region, and thus, may remove the influence of a parasitic capacitance due to the other cell regions. Accordingly, when writing to a memory cell, a surge current that may occur due to a parasitic capacitance may be prevented, and the ability to adjust for variations in resistance of the memory cell may be improved.

The control logic 130 may control an overall operation of the memory device 100, and may also control the write/read circuit 120 to perform a memory operation such as writing or reading. For example, the memory device 100 may include a power generator (not shown) generating various voltages used in write and read operations, and a voltage level of the voltages may be adjusted according to control of the control logic 130.

As described above, according to the memory device 100 according to an exemplary embodiment of the present disclosure, a surge current that may occur due to a parasitic capacitance during a write operation may be prevented, and adjustability of a variation in a resistance of a memory cell may be improved. Accordingly, durability and data reliability of the memory device 100 may be increased.

The memory controller 200 and the memory device 100 may be integrated as one semiconductor device. For example, the memory controller 200 and the memory device 100 may be integrated as one semiconductor device forming a memory card. For example, the memory controller 200 and the memory device 100 may be integrated into one semiconductor device and thus may configure a PC card (a PCMCIA card), a compact flash card (CF card), a smart media card (SM/SMC), a memory stick, a multimedia card (MMC, RS-MMC, or MMCmicro), a secure digital (SD) card (SD, miniSD, or microSD), or a universal flash storage (UFS). As another example, the memory controller 200 and the memory device 100 may be integrated into one semiconductor device and thus may form a Solid State Disk/Drive (SSD).

A detailed exemplary operation of the memory device 100 included in the resistive memory system 10 that may be configured as described above will be described with reference to FIG. 2.

Figure 2:
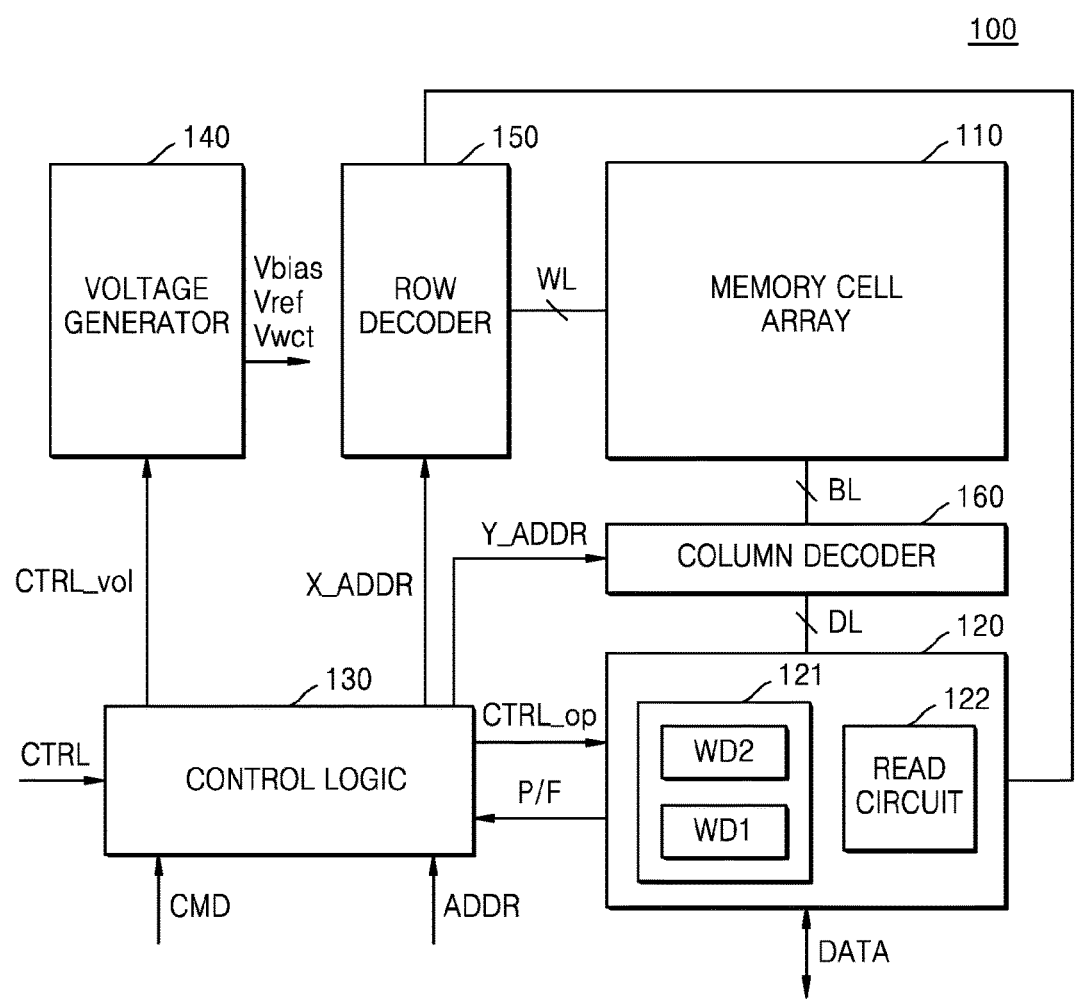
FIG. 2 is a block diagram of an example of a memory device of FIG. 1.

FIG. 2 is a block diagram of an example of the memory device 100 of FIG. 1.

Referring to FIG. 2, the memory device 100 may include the memory cell array 110, the write/read circuit 120, the control logic 130, and a voltage generator 140. In addition, the memory device 100 may further include a row decoder 150 and a column decoder 160.

The memory cell array 110 may be connected to a plurality of first signal lines and a plurality of second signal lines. Also, the memory cell array 110 may include a plurality of memory cells that are respectively arranged in regions where the plurality of first signal lines and the plurality of second signal lines cross each other. Hereinafter, it is assumed that the plurality of first signal lines are bit lines BL, and the plurality of second signal lines are word lines WL.

An address ADDR for indicating an access-target memory cell may be received. The address ADDR may include a row address X_ADDR for selecting a word line of the memory cell array 110, and a column address Y_ADDR for selecting a bit line of the memory cell array 110. The row decoder 150 may select a word line in response to the row address X_ADDR. The column decoder 160 may select a bit line in response to the column address Y_ADDR.

The write/read circuit 120 may include a write circuit 121 and a read circuit 122 and may write data in a memory cell or read data from a memory cell. According to an exemplary embodiment, the write/read circuit 120 may be connected to a bit line BL via the column decoder 160 to perform a write/read operation. According to another exemplary embodiment, the write/read circuit 120 may be connected to a word line WL via the row decoder 150 to perform a write/read operation. The write/read circuit 120 may write data DATA input from outside in the memory cell array 110 or output the data written in the memory cell array 110 to the outside, according to control of the control logic 130. Also, the write/read circuit 120 may provide the control logic 130 with a writing or reading result. For example, when performing a write operation, the write/read circuit 120 performs a verification operation in order to detect the result of the write operation, and may provide the control logic 130 with a verification result, for example, pass or fail information P/F.

The write/read circuit 120 may be connected to the bit lines BL or the word lines WL to write data to a memory cell or read data from a memory cell. For example, the write/read circuit 120 may be connected to a selected bit line BL or a selected word line WL to provide a selected memory cell with a program pulse, thereby performing a programming operation (that is, a write operation). Thus, data DATA to be stored in the memory cell array 110 may be written. Here, the programming pulse may be referred to as a write pulse. According to an exemplary embodiment, the program pulse may be a current pulse. According to another exemplary embodiment, the program pulse may be a voltage pulse.

In detail, the write circuit 121 may perform a set write operation that programs a memory cell such that resistance of the memory cell is reduced. Also, the write circuit 121 may perform a reset write operation that programs a memory cell such that resistance of the memory cell is increased. According to an exemplary embodiment, the write circuit 121 may provide a memory cell with a voltage or a voltage pulse in a reset write operation, and may provide a memory cell with a current or a current pulse in a set write operation.

According to the present exemplary embodiment, the write circuit 121 may include a first write driver WD1 and a second write driver WD2. The first write driver WD1 may be a voltage driver providing a voltage, and the second write driver WD2 may be a current driver converting the voltage into a current and providing a memory cell with the current. In a set write operation, the first write driver WD1 and the second write driver WD2 may operate together to provide a memory cell with a current or a current pulse.

The second write driver WD2 may be disposed between the first write driver WD1 and the memory cell array 110. According to an exemplary embodiment, the memory cell array 110 may include a plurality of cell regions, and the second write driver WD2 may be disposed adjacent to a corresponding cell region. According to an exemplary embodiment, the second write driver WD2 may be implemented as a portion of the row decoder 150 or the column decoder 160.

The first write driver WD1 may provide the second write driver WD2 with a write voltage. The second write driver WD2 may generate a write current based on the write voltage, and provide a memory cell with the write current. As the second write driver WD2, which is adjacent to a memory cell on which writing is performed, provides the memory cell with the write current, a surge current due to a parasitic capacitance component may be prevented. This will be described in more detail later with reference to FIGS. 8 through 18.

The read circuit 122 is connected to a bit line BL via the column decoder 160 or to a word line WL via the row decoder 150, and may read data DATA by sensing a resistance level of a selected memory cell. The read circuit 122 may thereby output the data DATA stored in the memory cell array 110.

In detail, the read circuit 122 may perform a general read operation on a memory cell MC if a reading command is received from the memory controller 200. Also, the read circuit 122 may perform a read operation on the memory cell MC before performing a write operation on the memory cell MC, that is, a pre-read operation for reading an initial resistance state of the memory cell MC.

Moreover, the read circuit 122 may perform a verify read operation for determining whether the writing in the memory cell MC is finished, after performing the write operation on the memory cell MC.

In a general read operation, the read circuit 122 may provide the read data DATA outside of the memory device 100, for example, to the memory controller 200. Also, in the pre-read operation or the verify read operation, the read circuit 122 may provide the read data DATA or a P/F signal, representing whether the reading or writing of the data has succeeded or not, inside of the memory device 100, for example, to the control logic 130 or the write circuit 121, as a result of the write/read operations.

The voltage generator 140 may generate various types of voltages for performing writing, reading, and erasing operations with respect to the memory cell array 110 based on a voltage control signal CTRL_vol. The voltage generator 140 may generate a bias voltage Vbias, a reference voltage Vref, a write control voltage Vwct or the like for driving the word lines WL and the bit lines BL. For example, the bias voltage Vbias may include a set write voltage Vset, a reset write voltage Vreset, a read voltage Vread, a row inhibit voltage Vinhx, or a column inhibit voltage Vinhy applied to the plurality of word lines WL or the plurality of bit lines BL. The bias voltage Vbias may be provided to the plurality of bit lines BL or the plurality of word lines WL via the row decoder 150 or the column decoder 160. The reference voltage Vref may be provided to the first write driver WD1. The first write driver WD1 may generate a write voltage based on the reference voltage Vref. The write control voltage Vwct may be provided to the second write driver WD2. The second write driver WD2 may generate a write current based on the write control voltage Vwct and the write voltage received from the first write driver WD1.

The control logic 130 may output various control signals for writing data DATA in or reading data DATA from the memory cell array 110 based on a command CMD, an address ADDR, and a control signal CTRL received from the memory controller 200. The various control signals output from the control logic 130 may be provided to the write/read circuit 120, the voltage generator 140, the row decoder 150, and the column decoder 160, and accordingly, the control logic 130 may control overall operations in the memory device 100.

In detail, the control logic 130 may generate operation control signals CTRL_op based on a command CMD and a control signal CTRL, and provide the operation control signals CTRL_op to the write/read circuit 120. The control logic 130 may also provide a row address X_ADDR to the row decoder 150, and provide a column address Y_ADDR to the column decoder 160. Furthermore, the control logic 130 may control write and read operations of the memory cell array 110 by referring to a pass/fail signal P/F received from the write/read circuit 120, and generate a voltage control signal CTRL_vol to provide the voltage control signal CTRL_op to the voltage generator 140.

Write/read circuit 120 communicates with column decoder 160 through data lines DL.

Figure 3:
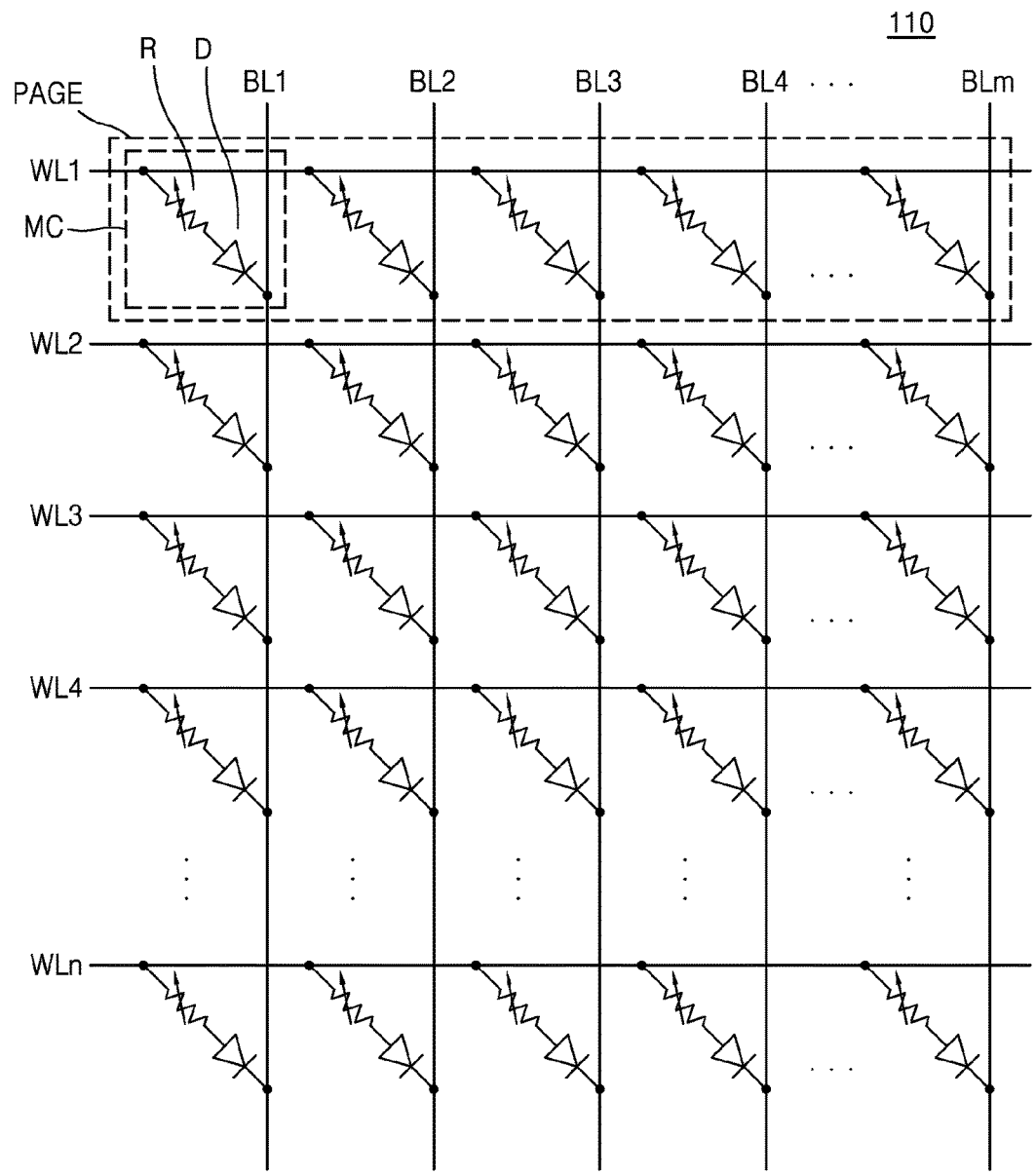
FIG. 3 is a circuit diagram illustrating an example of a memory cell array of FIG. 2.

FIG. 3 is a circuit diagram of an example of the memory cell array 110 of FIG. 2. The memory cell array 110 may include a plurality of memory blocks, and FIG. 3 may illustrate one memory block.

Referring to FIG. 3, the memory cell array 110 may include a plurality of word lines WL1-WLn, a plurality of bit lines BL1-BLm, and a plurality of memory cells MC. Memory cells MC selected by the same word line WL may be defined as a page PAGE. Here, the number of word lines WL, the number of bit lines BL, and the number of memory cells MC may vary depending on exemplary embodiments. Although FIG. 3 shows a two-dimensional memory having a horizontal structure, one or more exemplary embodiments are not limited thereto, that is, the memory cell array 110 may be a three-dimensional memory having a vertical structure.

According to the present exemplary embodiment, each of the plurality of memory cells MC may include a variable resistance device R and a selection device D. Here, the variable resistance device R may be referred to as a variable resistance material, and the selection device D may be referred to as a switching device.

According to an exemplary embodiment, the variable resistance device R may be connected between one of the plurality of bit lines BL1-BLm and the selection device D, and the selection device D may be connected between the variable resistance device R and one of the plurality of word lines WL1-WLn. However, the one or more exemplary embodiments of the present disclosure are not limited thereto, that is, the selection device D may be connected between one of the plurality of bit lines BL1-BLm and the variable resistance device R, and the variable resistance device R may be connected between the selection device D and one of the plurality of word lines WL1-WLn.

According to the present exemplary embodiment, the variable resistance device R may be switched to one of a plurality of resistance states by an electric pulse applied thereto. According to an exemplary embodiment, the variable resistance device R may include a phase-change material, a crystallization status of which varies depending on an amount of electric current. The phase-change material may vary, and may be, for example, GaSb, InSb, InSe, $Sb_2Te_3$, or GeTe that are compounds of two elements, GeSbTe, GaSeTe, InSbTe, $SnSb_2Te_4$, or InSbGe that are compounds of three elements, and AgInSbTe, (GeSn)SbTe, GeSb(SeTe), or $Te_{81}Ge_{15}Sb_2S_2$ that are compounds of four elements.

The phase-change material may be in an amorphous state having a relatively high resistance and a crystalline state having a relatively low resistance. The phase of the phase-change material may be changed by Joule's heat generated according to an amount of electric current. In addition, data may be written by using the phase change.

In addition, according to another exemplary embodiment, the variable resistance device R may include perovskite compounds, transition metal oxide, magnetic materials, ferromagnetic materials, or antiferromagnetic materials, instead of the phase-change material.

The selection device D may be connected between one of the plurality of word lines WL1-WLn and the variable resistance material R, and may control supply of electric current to the variable resistance device R according to a voltage applied to the connected word line and the bit line. According to an exemplary embodiment, the selection device D may be a PN junction diode or a PIN junction diode. An anode of the diode may be connected to the variable resistance device R, and a cathode of the diode may be connected to one of the plurality of word lines WL1-WLn. Here, if a voltage difference between the anode and the cathode of the diode becomes greater than a threshold voltage of the diode, the diode is turned on so as to supply electric current to the variable resistance device R. In FIG. 3, the selection device D is shown as a diode; however, one or more exemplary embodiments of the present disclosure are not limited thereto, that is, the selection device D may be another device that may be switched.

Figure 4:
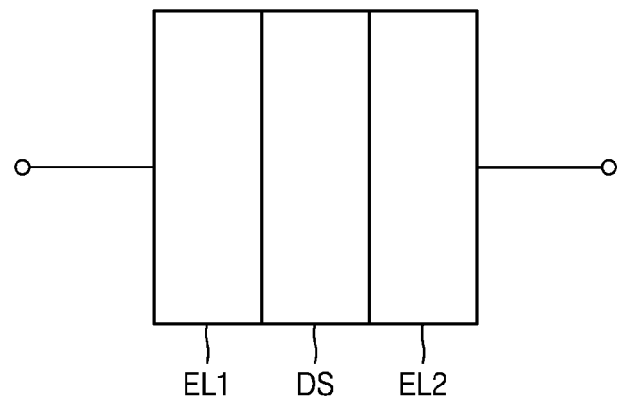
FIG. 4 illustrates a variable resistance device included in a memory cell of FIG. 3 according to an exemplary embodiment.

FIG. 4 illustrates the variable resistance device R included in the memory cell MC of FIG. 3 according to an exemplary embodiment.

Referring to FIG. 4, the variable resistance device R includes first and second electrodes EL1 and EL2 and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminium (Al), copper (Cu), titanium nitride (TiN), titanium aluminium nitride ($Ti_xAl_yN_z$), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide ($IrO_2$), or strontium zirconate oxide ($StZrO_3$).

The data storage film DS may be a bipolar resistive memory material or a unipolar resistive memory material. The bipolar resistive memory material may be programmed as a set state or a reset state according to a polarity of a pulse, and the unipolar resistive memory material may be a perovskite-based material. In addition, the unipolar resistive memory material may be programmed as a set state or a reset state according to pulses of the same polarity, and the unipolar resistive memory material may be a transition metal oxide such as NiOx or TiOx.

Figure 5A:
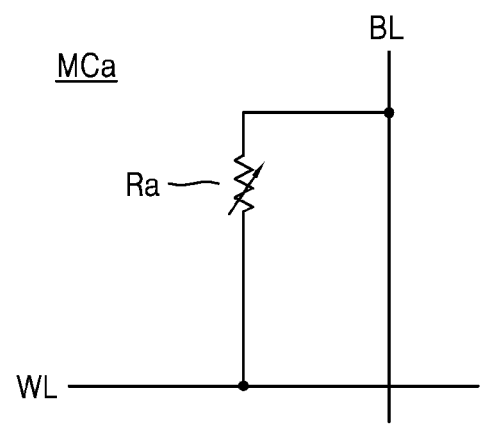
FIGS. 5A through 5C are circuit diagrams showing modified examples of the memory cell of FIG. 3.
Figure 5B:
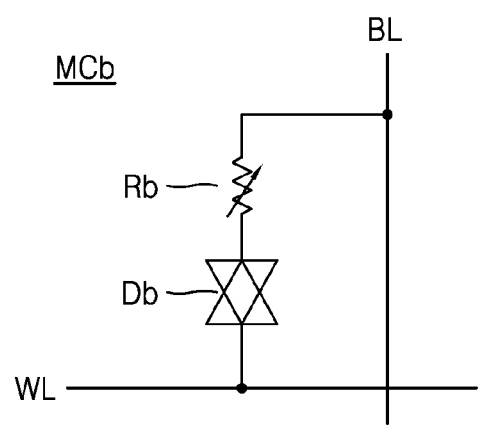
Figure 5C:
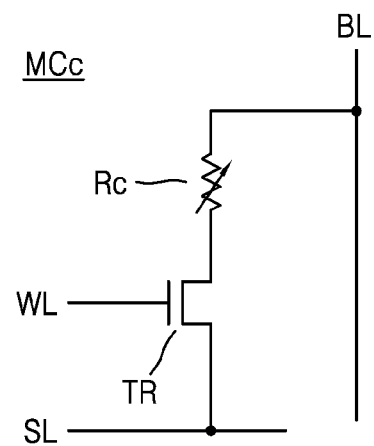

FIGS. 5A through 5C are circuit diagrams showing modified examples of the memory cell MC shown in FIG. 3.

Referring to FIG. 5A, a memory cell MCa may include a variable resistance device Ra, and the variable resistance device Ra may be connected between a bit line BL and a word line WL. The memory cell MCa may store data by using voltages applied to the bit line BL and the word line WL.

Referring to FIG. 5B, a memory cell MCb may include a variable resistance device Rb and a bidirectional diode Db. The variable resistance device Rb may include a resistor material for storing data. The bidirectional diode Db is connected between the variable resistance device Rb and a word line WL, and the variable resistance device Rb may be connected between a bit line BL and the bidirectional diode Db. Locations of the bidirectional diode Db and the variable resistance device Rb may be exchanged. A leakage current flowing in non-selected resistor cells may be blocked by the bidirectional diode Db.

Referring to FIG. 5C, a memory cell MCc may include a variable resistance device Rc and a transistor TR. The transistor TR may be a selection device for supplying or blocking electric current to the variable resistance device Rc according to a voltage of a word line WL, that is, a switching device. The transistor TR may be connected between the variable resistance device Rc and a source line SL, and the variable resistance device Rc may be connected between a bit line BL and the transistor TR. Locations of the transistor TR and the variable resistance device Rc may be exchanged. The memory cell MCc may be selected or may not be selected according to turning on/turning off of the transistor TR that is driven via the word line WL.

Figure 6A:
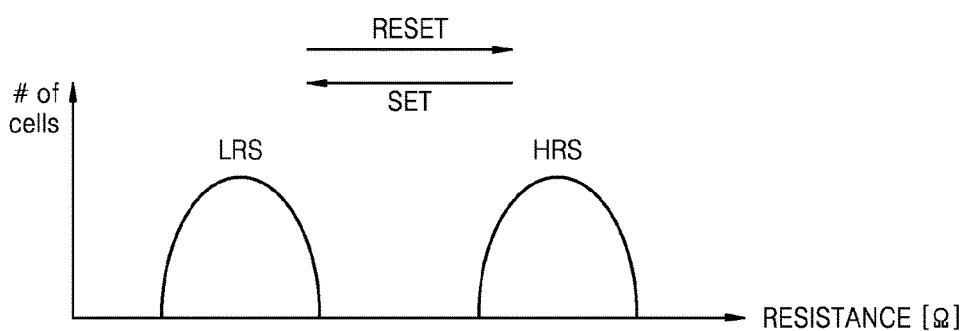
FIGS. 6A and 6B are graphs illustrating a resistance distribution of memory cells.
Figure 6B:
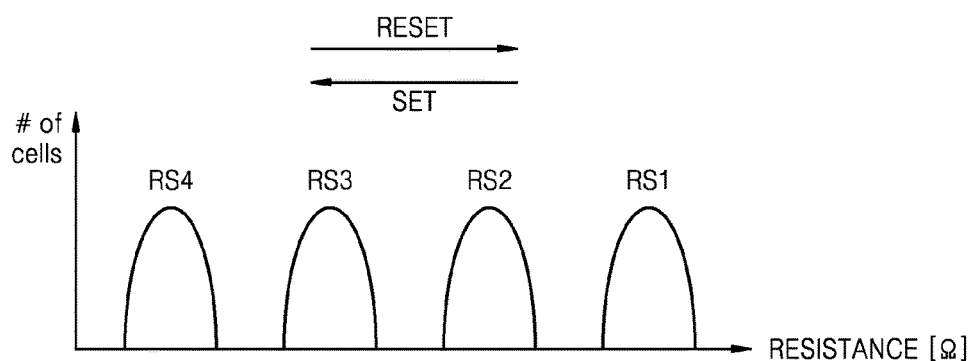

FIGS. 6A and 6B are graphs illustrating a resistance distribution of memory cells. FIG. 6A corresponds to a memory cell MC which is an SLC, and FIG. 6B corresponds to a memory cell MC which is an MLC. In FIGS. 6A and 6B, a horizontal axis denotes resistance, and a vertical axis denotes the number of memory cells MC.

Referring to FIG. 6A, when the memory cell MC is an SLC that is programmed with one bit, the memory cell MC may have a low-resistance state LRS or a high-resistance state HRS. The low-resistance state LRS may be referred to as a set state, and the high-resistance state HRS may be referred to as a reset state.

The low-resistance state LRS and the high-resistance state HRS may correspond to one of data '0' and data '1'. According to an exemplary embodiment, a resistance level R may increase from data '0' to data '1'. The low-resistance state LRS may correspond to data '0', and the high-resistance state HRS may correspond to data '1'.

An operation of applying a write pulse to the memory cell MC to switch the memory cell MC from a high-resistance state HRS to a low-resistance state LRS is referred to as a set operation or a set write operation. Also, an operation of applying a write pulse to the memory cell MC to switch the memory cell MC from a low-resistance state LRS to a high-resistance state HRS is referred to as a reset operation or a reset write operation.

Referring to FIG. 6B, when the memory cell MC is an MLC programmed with two bits, the memory cell MC may be in one of a first resistance state RS1, a second resistance state RS2, a third resistance state RS3, and a fourth resistance state RS4.

However, the exemplary embodiment of the present disclosure is not limited thereto, and according to another exemplary embodiment, a plurality of memory cells may include triple level cells (TLC) that store three-bit data. Accordingly, the memory cells may have one of eight resistance states. According to another exemplary embodiment, the memory cells may include memory cells that may each store at least four-bit data.

Compared to an SLC, intervals between resistance distributions are relatively narrow with respect to an MLC, and thus, a relatively small variation in a resistance of an MLC may cause a read error in the MLC. Thus, the first through fourth resistance states RS1, RS2, RS3, and RS4 may have resistor ranges that do not overlap with one another in order to secure a read margin.

Each of the first through fourth resistance states RS1, RS2, RS3, and RS4 may correspond to one of data '00', data '01', data '10', and data '11'. According to an exemplary embodiment, a resistance level R may increase in the order of data '11', data '01', data '00', and '10'. That is, the fourth resistance state RS4 may correspond to data '11'; the third resistance state RS3 may correspond to data '01'; the second resistance state may correspond to data '00'; and the first resistance state RS1 may correspond to data '10'.

Figure 7:
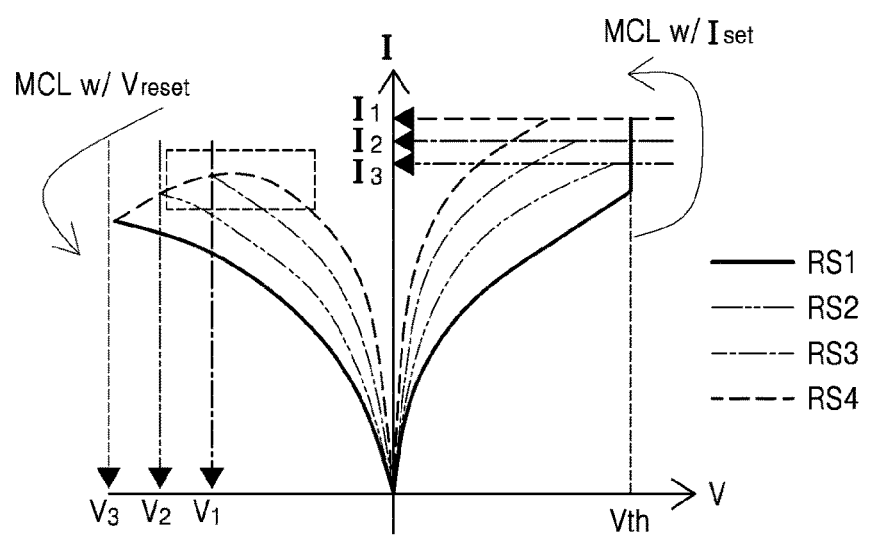
FIG. 7 is a graph showing a voltage-current characteristic curve of a memory cell.

FIG. 7 is a graph showing a voltage-current characteristic curve of a memory cell.

Referring to FIG. 7, a horizontal axis denotes a voltage V, and a vertical axis denotes a current I. If a memory cell MC is an MLC, the memory cell MC may have one of a plurality of resistance states according to stored data. For example, as illustrated in FIG. 7, a memory cell MC may have one of first through fourth resistance states RS1, RS2, RS3, and RS4. Resistance states of the memory cell MC may be defined such that the memory cell MC has a highest resistance in the first resistance state RS1 and a lowest resistance in the fourth resistance state RS4.

As shown in the right side portion of the graph of FIG. 7, a resistance level of a memory cell may be reduced via a set write operation. On the other hand, as shown in the left side portion of the graph, a resistance level of a memory cell may be increased via a reset write operation.

Meanwhile, when a voltage equal to or higher than a threshold voltage Vth is applied to the memory cell MC, a current of the memory cell MC abruptly increases so that it is difficult to control a current for writing a resistance level according to data to be programmed. Thus, according to the present exemplary embodiment, a write current Iset or a write current pulse may be applied to the memory cell MC when performing a set write operation on the memory cell MC.

When a set write current Iset or a set write current pulse is applied to the memory cell MC, a resistance state of the memory cell MC may be changed from a present resistance state to a relatively low resistance state. An amount of change of the resistance state of the memory cell MC may be varied according to an amount of the set write current Iset or the set write current pulse. For example, as shown in FIG. 7, when the memory cell MC is in the first resistance state RS1, the memory cell MC may be changed to one of the second through fourth resistance states RS2 through RS4 according to an amount of the set write current Iset or the set write current pulse.

In order to perform a reset write operation, a current applied to the memory cell MC is to be adjusted to decrease after the current has reached a peak current (indicated by a dotted box of FIG. 7), and thus, it is difficult to perform a reset write operation on the memory cell MC by using a typical rectangular pulse. Accordingly, when performing a reset write operation on the memory cell MC, a write voltage pulse Vreset may be applied to the memory cell MC.

As the reset write voltage Vreset or a reset write voltage pulse is applied to the memory cell MC, a resistance state of the memory cell MC may be changed from a present resistance state to a relatively high-resistance state. An amount of change of the resistance state of the memory cell MC may be varied according to an amount of the reset write voltage Vreset or the reset write voltage pulse. For example, as shown in FIG. 7, when the memory cell MC is in the fourth resistance state RS4, the memory cell MC may be changed to one of the first through third resistance states RS1 through RS3 according to an amount of the reset write voltage Vreset or the reset write voltage pulse.

Figure 8:
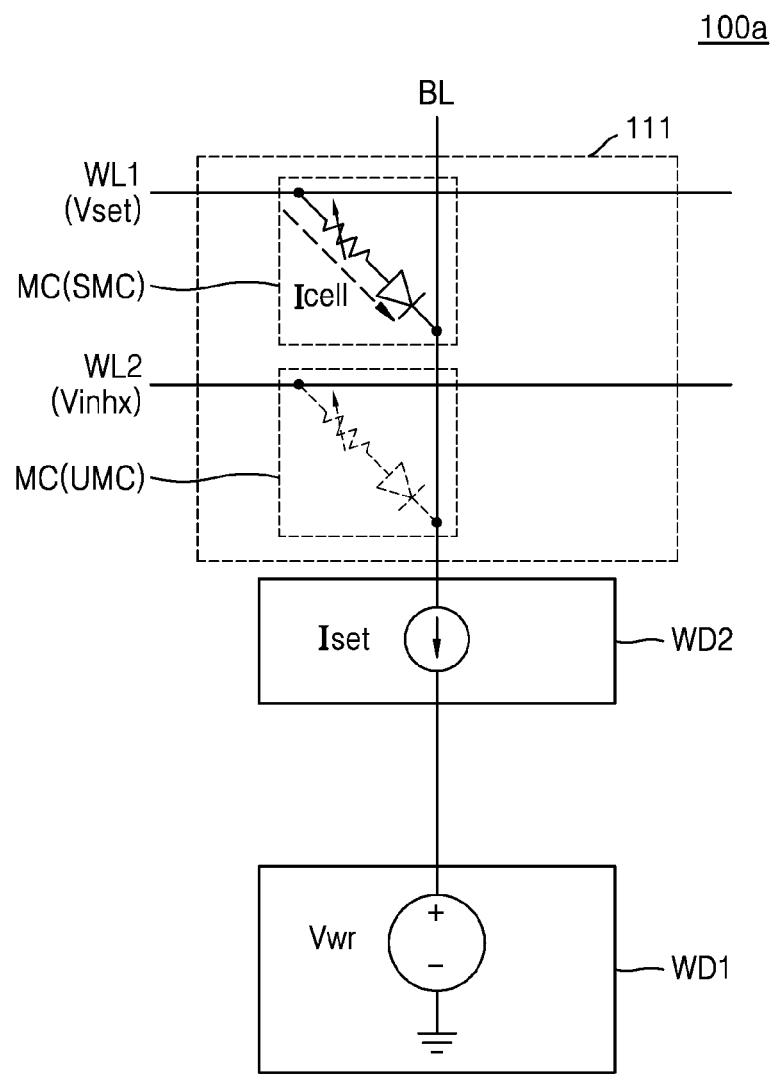
FIG. 8 is a circuit diagram of an example of a memory device according to an exemplary embodiment of the present disclosure.

FIG. 8 is a circuit diagram of a memory device 100a which is an example of a memory device according to an exemplary embodiment of the present disclosure.

Referring to FIG. 8, the memory device 100a may include a first memory cell array 111, a first driver WD1, and a second driver WD2. The memory device 100a according to the present exemplary embodiment is an exemplary embodiment of the memory device 100 of FIG. 2, and description provided with reference to FIG. 2 may also apply to the present exemplary embodiment. Also, although not shown in FIG. 8, elements of the memory device 100 of FIG. 2 may also be included in the memory device 100a of the present exemplary embodiment.

The first memory cell array 111 may include a plurality of word lines WL1 and WL2, a plurality of bit lines BL, and a plurality of memory cells MC connected between the plurality of word lines WL1 and WL2 and the plurality of bit lines BL. FIG. 8 illustrates, for convenience of description, that the first memory cell array 111 includes two word lines WL1 and WL2 and one bit line BL.

The first write driver WD1 may provide a write voltage Vwr for writing data to the memory cells MC. The first write driver WD1 may be a voltage driver providing the write voltage Vwr, and may provide the write voltage Vwr to the second write driver WD2.

The second write driver WD2 may be arranged between the first memory cell array 111 and the first write driver WD1. The second write driver WD2 may be disposed adjacent to the first memory cell array 111, and may be connected to the bit line BL of the first memory cell array 111. The second write driver WD2 may generate a write current Iset based on the write voltage Vwr received from the first write driver WD1, and may provide the write current Iset to the memory cells MC via the bit line BL. The second write driver WD2 may convert the write voltage Vwr into the write current Iset. Providing the write current Iset means sinking the write current Iset output from the memory cells MC or sourcing the write current Iset input to the memory cells MC.

Meanwhile, although the second write driver WD2 is illustrated as being connected to one bit line BL in FIG. 8, the exemplary embodiments are not limited thereto, and a plurality of bit lines may also be connected to the second write driver WD2. In a set write operation, one bit line selected from among the plurality of bit lines, for example, the bit line BL illustrated in FIG. 8, may be electrically connected to the second write driver WD2, and the second write driver WD2 may provide a write current Iset to the selected bit line BL.

In a set write operation on the first memory cell array 111, one of the plurality of word lines WL1 and WL2, here the word line WL1, may be selected. A set write voltage Vset may be applied to the selected word line WL1, and a row inhibit voltage Vinhx may be applied to the unselected word line WL2. A memory cell MC connected between the selected word line WL1 and the bit line BL may be referred to as a selected memory cell SMC, and a memory cell MC connected between the unselected word line WL2 and the bit line BL may be referred to as a unselected memory cell UMC.

A cell current Icell may flow through the selected memory cell SMC. As a forward cell current Icell flows through the selected memory cell SMC, a set write operation in which a resistance value of the selected memory cell SMC is reduced may be performed. No current flows through the unselected memory cell UMC, and accordingly, a write current Iset received from the second write driver WD2 may flow through the selected memory cell SMC. In other words, a current amount of the cell current Icell of the selected memory cell SMC may be the same or similar as a current amount of the write current Iset.

Meanwhile, although not illustrated, the memory device 100a may further include another memory cell array, for example, a second memory cell array, and another second write driver providing the second memory array with a write current, and the first write driver WD1 may provide a write voltage Vwr to the other second write driver connected to the second memory cell array in a write operation on the second memory cell array. As described above, when a plurality of memory cell arrays are electrically connected to the first write driver WD1, in a write operation on one memory cell array, the other memory cell array may be regarded as a parasitic capacitance component. When a write driver driving a plurality of memory cells provides a write current to one memory cell array, a long time is required until a current applied by the write driver is delivered to a memory cell due to the parasitic capacitance component, and an abrupt change of a resistance value of the memory cell is not compensated. Thus, an unintended surge current may flow through the memory cell, and a resistance value of the memory cell may not be changed to a desired resistance value.

However, in the memory device 100a according to the present exemplary embodiment, the first write driver WD1 provides a write voltage Vwr, and the second write driver WD2 disposed adjacent to the first memory cell array 111 converts the write voltage Vwr received from the first write driver WD1 into a write current Iset and provides the same to a memory cell MC, thereby reducing the influence due to a parasitic capacitance existing between the first memory cell array 111 and the first write driver WD1 and preventing a surge current from flowing through the memory cell MC. Thus, durability of the memory device 100a may be increased, and a write disturbance due to the surge current may be prevented, thereby increasing data reliability of the memory device 100a.

Figure 9:
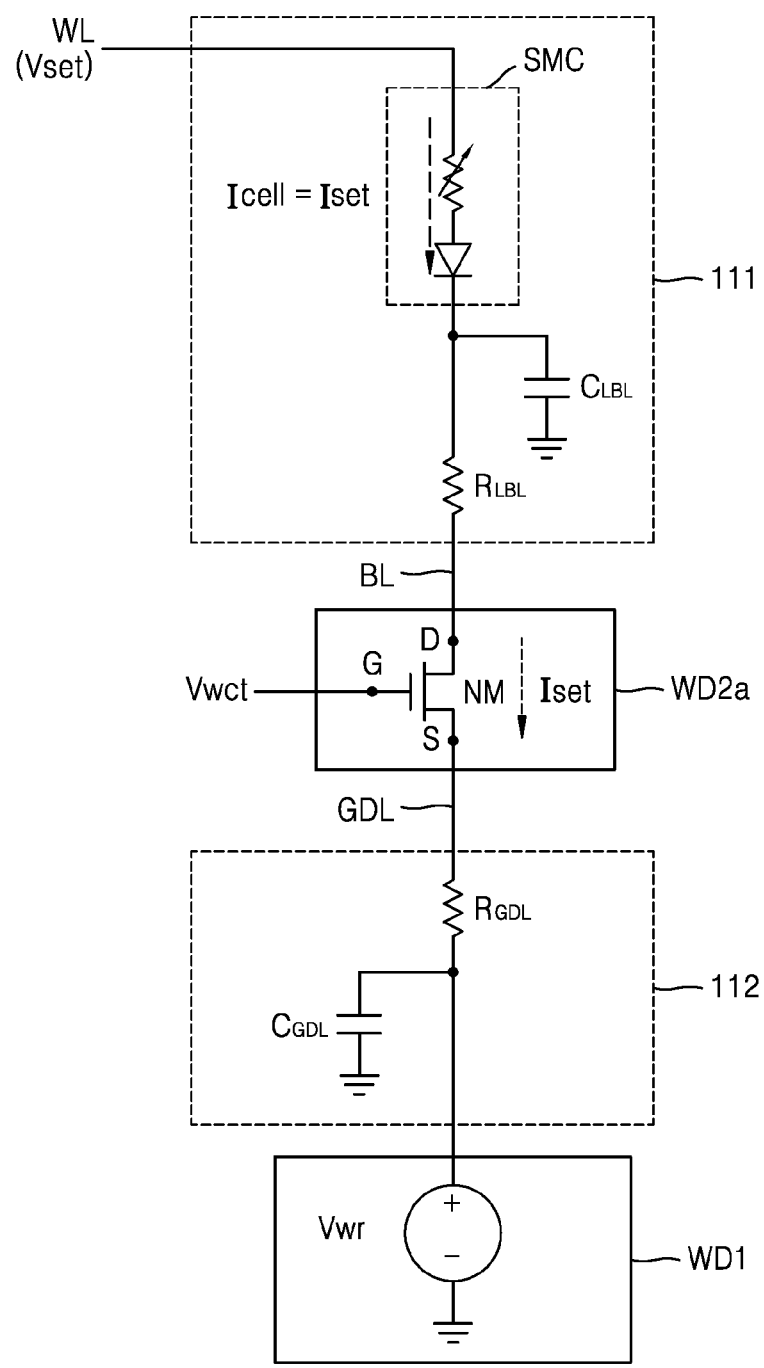
FIG. 9 is a circuit diagram of a memory device according to an exemplary embodiment of the present disclosure.

FIG. 9 is a circuit diagram of a memory device 100b according to an exemplary embodiment of the present disclosure. FIG. 9 is a detailed circuit diagram of the memory device 100a of FIG. 8A, and description provided above with reference to FIG. 8 may be applied to the present exemplary embodiment. Here, the description will focus on an exemplary embodiment in which a set write operation is performed on a selected memory cell SMC of the first memory cell array 111.

Referring to FIG. 9, the memory device 100b may include a first memory cell array 111, a second memory cell array 112, a first write driver WD1, and a second write driver WD2a.

The first memory cell array 111 may include a plurality of memory cells, and when a write operation is performed on the selected memory cell SMC, other unselected memory cells connected to the same bit line BL as the selected memory cell SMC may be represented as a parasitic capacitance component, for example, as a bit line capacitor $C_{LBL}$. The bit line BL may include a parasitic resistance component, for example, a bit line resistor $R_{LBL}$. The size of the bit line capacitor $C_{LBL}$ may be very small, and thus, the bit line capacitor $C_{LBL}$ will not be considered here in regard to a write operation to the selected memory cell SMC.

The selected memory cell SMC of the first memory cell array 111 may be connected to the bit line BL, and a first end of a second write driver WD2a may be connected to the bit line BL. A second end of the second write driver WD2a may be connected to a global data line GDL. A second memory cell array 112 may be connected to the global data line GDL.

The second memory cell array 112 indicates at least one memory cell array other than the first memory cell array 111. When performing a write operation on the selected memory cell SMC, the second memory cell array 112 may be represented as a parasitic component, for example, as a data line capacitor $C_{GDL}$. The data line capacitor $C_{GDL}$ may be much larger than the bit line capacitor $C_{LBL}$. The global data line GDL may include a parasitic resistance component, for example, a data line resistor $R_{GDL}$.

The first write driver WD1 may be connected to the global data line GDL, and may provide the second write driver WD2*a* with a write voltage Vwr via the global data line GDL.

The second write driver WD2*a* may generate a write current Iset based on the write voltage Vwr received from the first write driver WD1 and a write control voltage Vwct. As described with reference to FIG. 2, the write control voltage Vwct be provided by the voltage generator 140 (FIG. 2). The write control voltage Vwct may have a predetermined preset voltage level. A voltage level of the write control voltage Vwct may be higher than a voltage level of the write voltage Vwr.

According to the present exemplary embodiment, the second write driver WD2*a* may include a first transistor NM. The first transistor NM may be an NMOS transistor. A drain D of the first transistor NM may be connected to the bit line BL, and a source S thereof may be connected to the global data line GDL. The write voltage Vwr may be applied to the source S of the first transistor NM. However, when considering the data line resistor $R_{GDL}$, a voltage having a voltage level corresponding to the write voltage Vwr that is increased by a result calculated by multiplying the write current Iset by the data line resistor $R_{GDL}$ may be applied to the source S of the first transistor NM. The write control voltage Vwct may be applied to a gate G of the first transistor NM.

The first transistor NM may generate a write current Iset based on a difference between voltages of the gate G and the source S (hereinafter, the difference is referred to as a voltage Vgs). Since a voltage level of the write control voltage Vwct is uniform, the write current Iset may be varied according to a voltage level of the source S of the first transistor NM. As described above, the second write driver WD2*a* may generate the write current Iset based on the write voltage Vwr received from the first write driver WD1, and control a current amount of the write current Iset.

In the memory device 100*b* according to the present exemplary embodiment, the first write driver WD1 may provide the write voltage Vwr, and the second write driver WD2*a* disposed adjacent to the first memory cell array 111 may convert the write voltage Vwr received from the first write driver WD1 into the write current Iset and provide the write current Iset to the selected memory cell SMC via the bit line BL. The cell current Icell flowing through the selected memory cell SMC may be the same or similar as the write current Iset.

As described above, as the current amount of the cell current Icell flowing through the selected memory cell SMC is controlled by the second write driver WD2*a* disposed adjacent to the first memory cell array 111 in the memory device 100*b*, the current amount of the cell current Icell is not affected by the data line capacitor $C_{GDL}$. Thus, a resistance value of the selected memory cell SMC may be easily adjusted to a desired resistance value.

Figure 10:
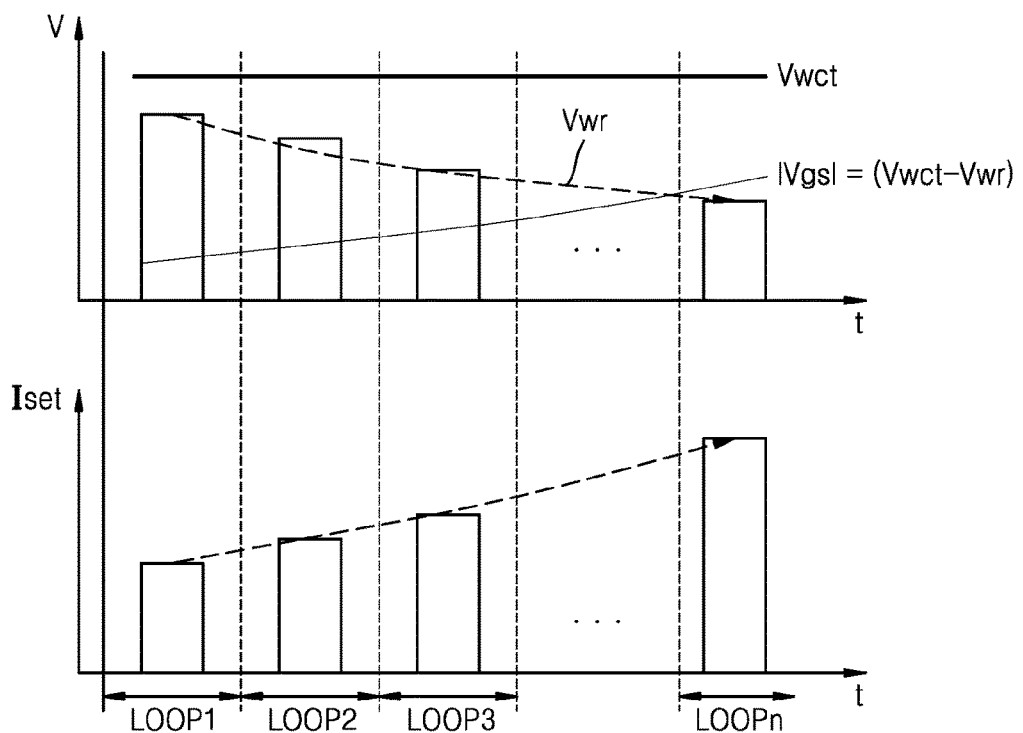
FIG. 10 is a graph showing a variation of a write voltage and a write current in the memory device of FIG. 9.

FIG. 10 is a graph showing a variation of the write voltage Vwr and the write current Iset in the memory device 100*b* of FIG. 9.

In a set write operation on a memory cell, in order to increase a write speed and decrease a resistance distribution of the memory cell, an incremental step pulse programming (ISPP) method may be used. According to the ISPP method, as a value of a program loop increases, a current amount of the write current Iset may be increased.

Meanwhile, as described with reference to FIG. 9, the second write driver WD2*a* may generate a write current Iset based on the write voltage Vwr received from the first write driver WD1. Thus, by varying a voltage level of the write voltage Vwr, a current amount of the write current Iset may be varied. The current amount of the write current Iset may be represented by Equation 1.

$$Iset = \alpha \times (Vgs - Vth)^2 \quad \text{[Equation 1]}$$

Here, α denotes a coefficient based on physical characteristics of the first transistor NM, and Vth denotes a threshold voltage of the first transistor NM.

According to Equation 1, the write current Iset may be approximately proportional to the square of the voltage Vgs. As the voltage Vgs increases, the write current Iset may be increased. A voltage level of the write control voltage Vwct may be uniform, and a voltage level of the write voltage Vwr may be lower than the voltage level of the write control voltage Vwct. Thus, as a value of a program loop increases, the memory device 100*b* (FIG. 9) may increase a current amount of the write current Iset by reducing the voltage level of the write voltage Vwr.

Figure 11:
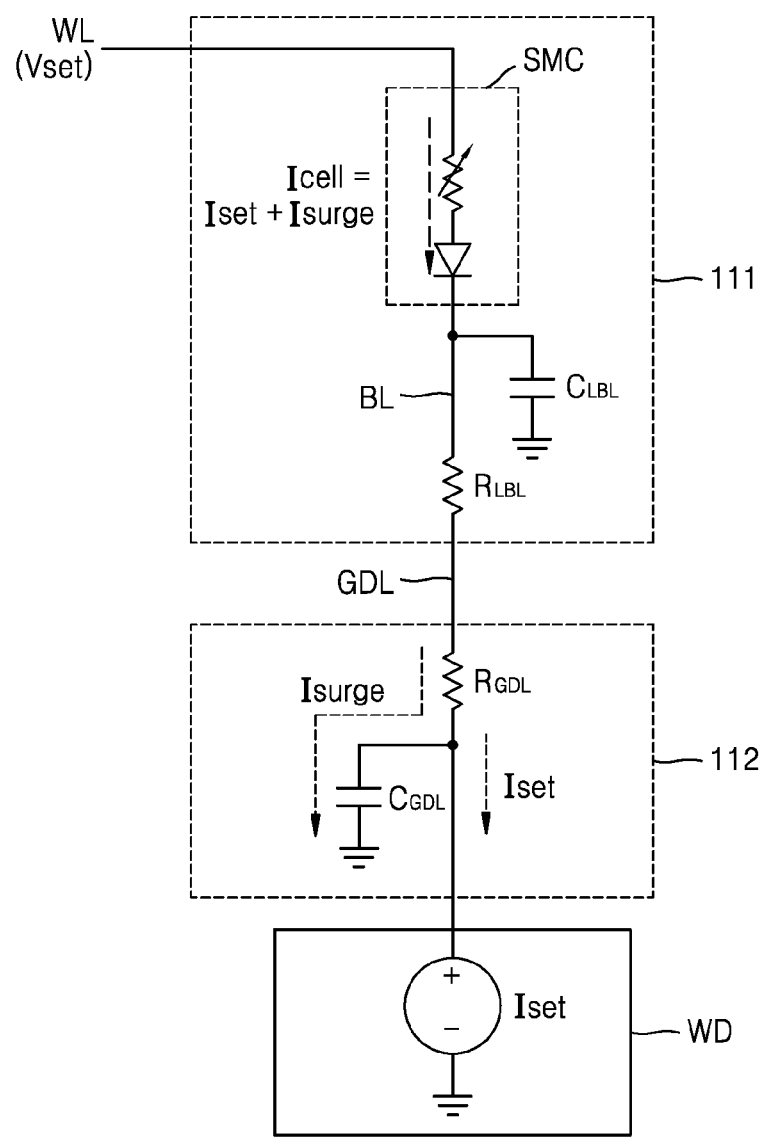
FIG. 11 is a circuit diagram of a memory device described as a comparative example for the memory device according to the present exemplary embodiment.

FIG. 11 is a circuit diagram of a memory device 500 described as a comparative example for the memory device according to the present exemplary embodiment.

Referring to FIG. 11, the memory device 500 may include a first memory cell array 111, a second memory cell array 112, and a write driver WD.

The first memory cell array 111 and the second memory cell array 112 are respectively the same as the first memory cell array 111 and the second memory cell array 112 of FIG. 9. Thus, repeated description will be omitted.

In FIG. 11, a bit line BL of the first memory cell array 111 may be connected to a global data line GDL. When performing a write operation on a selected memory cell SMC, the second memory cell array 112 may be represented as a parasitic component, for example, as a data line capacitor $C_{GDL}$. The data line capacitor $C_{GDL}$ may be far greater than a bit line capacitor $C_{LBL}$. Meanwhile, the global data line GDL may include a parasitic resistance component, for example, a data line resistor $R_{GDL}$.

The write driver WD may be connected to the global data line GDL. The write driver WD may generate a write current Iset to provide the same to the selected memory cell SMC of the first memory cell array 111. Meanwhile, when the write current Iset flows through the selected memory cell SMC, a resistance value of the selected memory cell SMC may be reduced abruptly. As the resistance value of the selected memory cell SMC changes, a cell current Icell flowing through the selected memory cell SMC may be maintained to be equal to the write current Iset only when a voltage level of the bit line BL increases abruptly. However, since the voltage level of the bit line BL is changed slowly due to the data line capacitor $C_{GDL}$, not only the write current Iset but also a surge current Isurge which is not expected may flow through the selected memory cell SMC. The surge current Isurge may charge the data line capacitor $C_{GDL}$. Here, due to an RC delay by the data line capacitor $C_{GDL}$ and the data line resistor $R_{GDL}$, the voltage level of the bit line BL may increase slowly. Thus, it is difficult to adjust the current amount of the cell current Icell flowing through the selected memory cell SMC.

As described above, in the memory device 500 of FIG. 11, when the write driver WD provides the write current Iset, a surge current due to the data line capacitor $C_{GDL}$ may be generated, and accordingly, it is difficult to control a resistance value of the selected memory cell SMC to a desired resistance value.

Figure 12A:
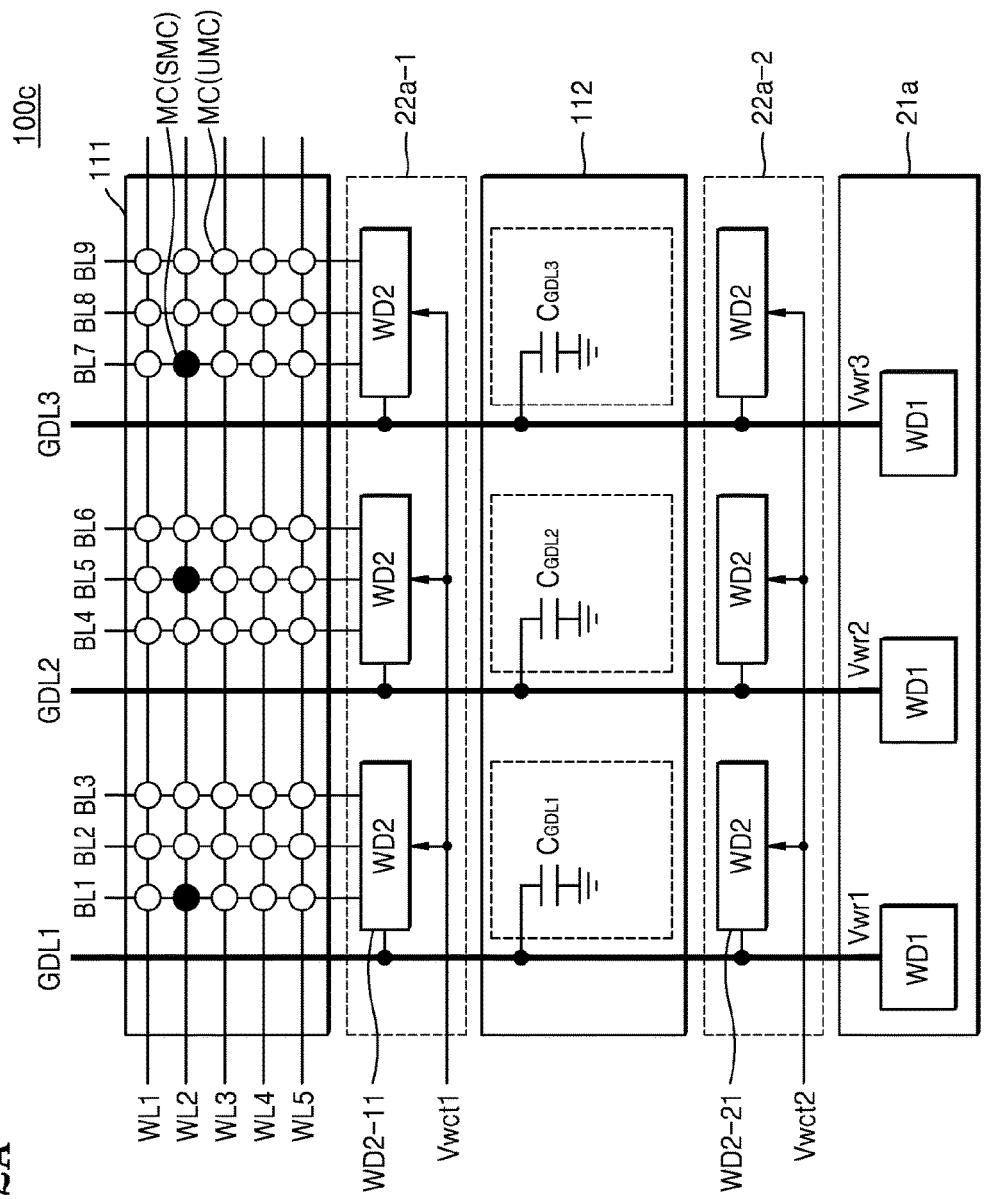
FIG. 12A is a schematic block diagram illustrating another example of a memory device according to an exemplary embodiment of the present disclosure.

FIG. 12A is a schematic block diagram illustrating a memory device 100c, which is another example of a memory device according to an exemplary embodiment of the present disclosure.

Referring to FIG. 12A, the memory device 100c may include a plurality of memory cell arrays 111 and 112, a first write circuit 21a, and a plurality of second write circuits 22a-1 and 22a-2. The first write circuit 21a may include a plurality of first write drivers WD1, and the plurality of second write circuits 22a-1 and 22a-2 may each include a plurality of second write drivers WD2 connected to the plurality of memory cell arrays 111 and 112. Meanwhile, while the memory device 100c of FIG. 12A is illustrated as including two memory cell arrays 111 and 112, the exemplary embodiments of the present disclosure are not limited thereto. The memory device 100c may include three or more memory cell arrays, and a second write circuit may be connected to each of the memory cell arrays.

The first memory cell array 111 and the second memory cell array 112 may include a plurality of bit lines BL1 through BL9, a plurality of word lines WL1 through WL5, and a plurality of memory cells MC arranged in regions where the bit lines BL1 through BL9 and the word lines WL1 through WL5 cross each other. The number of bit lines and word lines included in each of the memory cell arrays 111 and 112 may be various. Hereinafter, the memory device 100c will be described with respect to a write operation on the first memory cell array 111, and thus, the second memory cell array 112 will be briefly represented as a parasitic component, for example, as data line capacitors $C_{GDL1}$, $C_{GDL2}$, and $C_{GDL3}$.

At least one of the plurality of bit lines BL1 through BL9 of the first memory cell array 111 may be connected to the second write drivers WD2. For example, as illustrated in FIG. 12A, three bit lines may be connected to each of the second write drivers WD2. One bit line selected from among the plurality of bit lines and connected to a selected memory cell SMC may be electrically connected to each of the second write drivers WD2 to receive a write current from the second write drivers WD2. The second write drivers WD2 may generate a write current based on an applied write voltage as described with reference to FIGS. 8 and 9. The second write drivers WD2 may provide the selected memory cell SMC with the write current via a selected bit line.

The plurality of second write drivers WD2 may be respectively connected to a plurality of global data lines GDL1, GDL2, and GDL3. Also, the plurality of first write drivers WD1 included in the first write circuit 21a may be respectively connected to the plurality of global data lines GDL1, GDL2, and GDL3. As described above with reference to FIGS. 8 and 9, the first write drivers WD1 may provide a write voltage. The plurality of first write drivers WD1 may provide corresponding second write drivers WD2 with a write voltage via the connected global data lines GDL1, GDL2, and GDL3.

Meanwhile, according to the present exemplary embodiment, the plurality of first write drivers WD1 may provide different write voltages Vwr1, Vwr2, and Vwr3. Selected memory cells SMC may be programmed to different resistance states, and when the selected memory cells SMC are programmed from a previous resistance state to another resistance state, the changes in resistance of the selected memory cells SMC may be different from one another. In programming the selected memory cells SMC, different write currents are to be applied to selected bit lines, for example, to a first bit line BL1, a fifth bit line BL5, and a seventh bit line BL7. Accordingly, the plurality of first write drivers WD1 may respectively provide different write voltages Vwr1, Vwr2, and Vwr3 to second write drivers WD2 respectively corresponding to the first write drivers WD1, in order to generate write currents based on the write voltages. According to data written to the selected memory cells SMC, voltage levels of the write voltages Vwr1, Vwr2, and Vwr3 may be different from or the same with one another.

Meanwhile, as described with reference to FIG. 9, the second write drivers WD2 may generate a write current based on applied write control voltages Vwct1 and Vwct2 and the write voltages Vwr1, Vwr2, and Vwr3 received from the first write drivers WD1. A plurality of second write drivers WD2 connected to the same memory cell array may receive a same write control voltage. For example, a first write control voltage Vwct1 may be applied to a plurality of second write drivers WD2 connected to the first memory cell array 111.

According to an exemplary embodiment, different write control voltages may be applied to second write drivers WD2 that are respectively connected to different memory cell arrays. For example, a first write control voltage Vwct1 may be applied to a plurality of second write drivers WD2 connected to the first memory cell array 111, and a second write control voltage Vwct2 may be applied to a plurality of second write drivers WD2 connected to the second memory cell array 112.

Voltage levels of the first write control voltages Vwct1 and the second write control voltage Vwct2 may be different from each other, and may vary according to a distance between the first write driver WD1 and the second write driver WD2. As illustrated in FIG. 12A, a distance between a second write driver WD2-11 and the first write driver WD1 may be greater than a distance between a second write driver WD2-21 and the first write driver WD1. Thus, a parasitic resistance component (not shown) between the second write driver WD2-11 and the first write driver WD1, for example, a data line resistance, may be greater than a parasitic resistance component between the second write driver WD2-21 and the first write driver WD1. Even though the first write driver WD1 provides the same write voltage, that is, the first write voltage Vwr1, due to an IR drop, a voltage level applied to the second write driver WD2-11 may be greater than a voltage level applied to the second write driver WD2-21. Thus, by considering the IR drop, a voltage level of the first write control voltage Vwct1 may be set to be higher than a voltage level of the second write control voltage Vwct2.

Figure 12B:
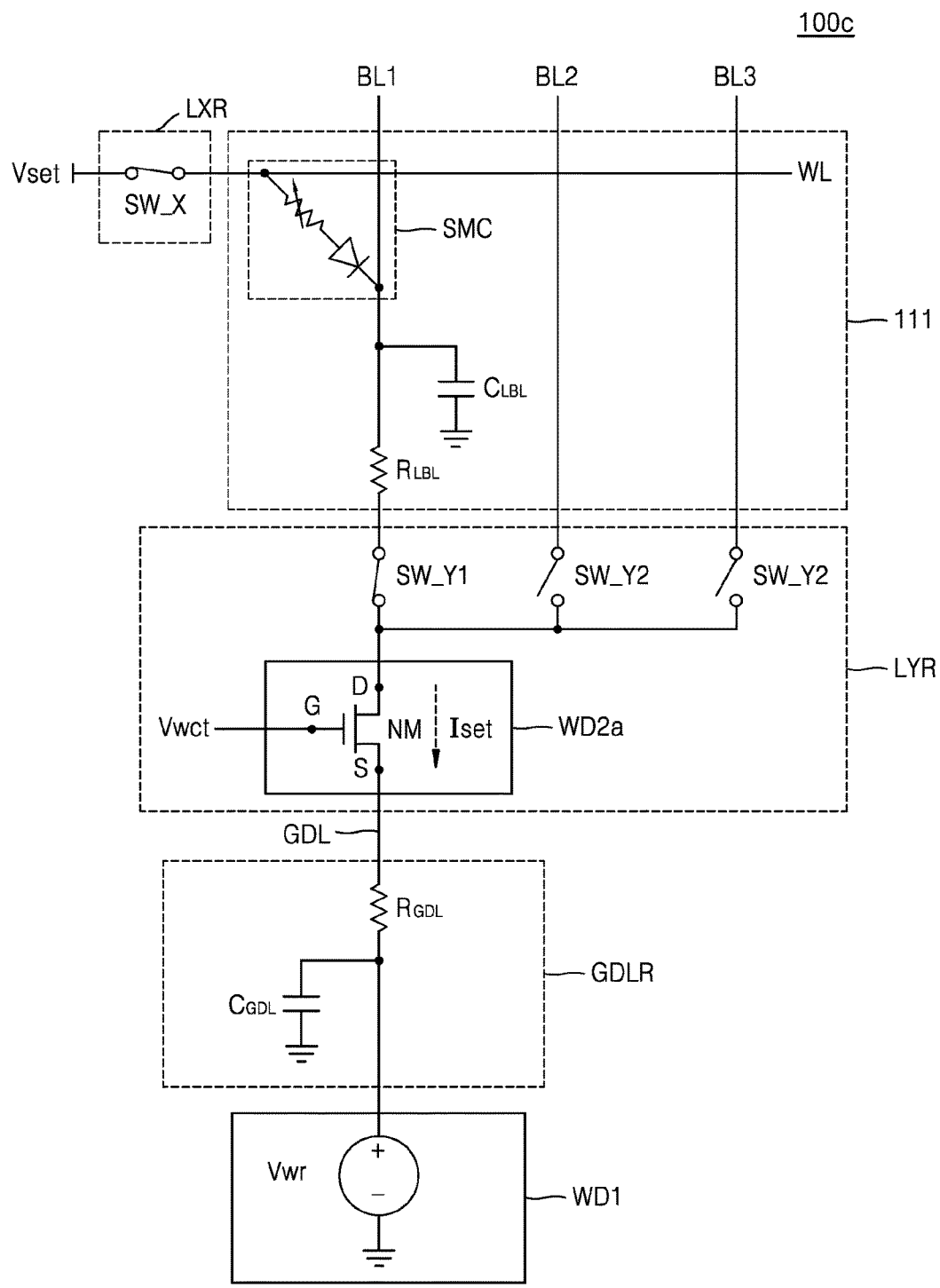
FIG. 12B is a detailed circuit diagram of the memory device of FIG. 12A.

FIG. 12B is a detailed circuit diagram of the memory device 100c of FIG. 12A.

Referring to FIG. 12B, the memory device 100c may include the first memory cell array 111, a local column region LYR, a local row region LXR, a global data line region GDLR, and the first write driver WD1.

The first memory cell array 111 is described above with reference to FIG. 12A, and thus repeated description will be omitted.

The global data line region GDRL may generally refer to a region where a global data line GDL and other memory cell arrays connected to the global data line GDRL, for example, the second memory cell array 112 of FIG. 12A, are arranged. The other memory cell arrays arranged in the global data line region GDRL will be modeled as a data line capacitor labeled $C_{GDL}$.

The local row region LXR may include a row switch SW_X providing a set write voltage Vset to a word line WL. The local row region LXR may be, for example, a row decoder. While FIG. 12B illustrates one switch SW_X for convenience of description, alternatively, a plurality of row switches SW_X may be respectively connected to a plurality of word lines of the first memory cell array 111 to provide a set write voltage Vset to a selected word line.

The local column region LYR may include column switches SW_Y1, SW_Y2, and SW_Y3 selecting a bit line BL and a second write driver WD2a. The local column region LYR may be, for example, a column decoder. The column switches SW_Y1, SW_Y2, and SW_Y3 may be respectively connected to a plurality of bit lines BL1 through BL3 so as to electrically connect the plurality of bit lines BL1 through BL3 to the second write driver WD2a. One of the column switches SW_Y1, SW_Y2, and SW_Y3 may be turned on to connect a selected bit line to the second write driver WD2a. Thus, the second write driver WD2a may generate a write current Iset based on a write voltage Vwr received from the first write driver WD1, and may provide the write current Iset to a selected bit line, for example, the first bit line BL1.

Figure 13:
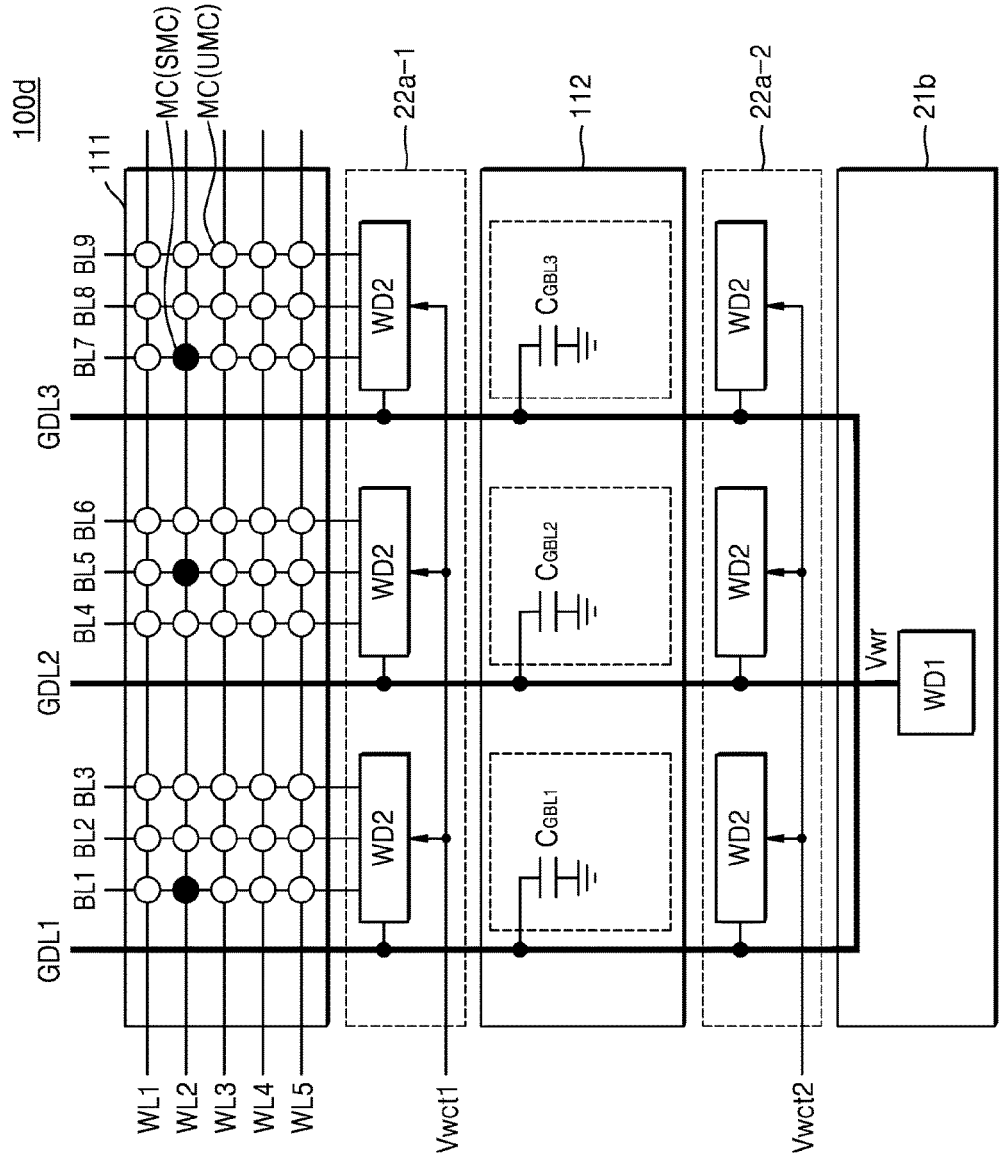
FIG. 13 is a block diagram illustrating a memory device according to an exemplary embodiment of the present disclosure.

FIG. 13 is a block diagram illustrating a memory device 100d according to an exemplary embodiment of the present disclosure.

The memory device 100d according to the present exemplary embodiment is similar to the memory device 100c of FIG. 12A. However, in the memory device 100d of the present exemplary embodiment, unlike the memory device 100c of FIG. 12A, a plurality of global data lines GDL1, GDL2, and GDL3 may be connected to one first write driver WD1. Thus, the plurality of global data lines GDL1, GDL2, and GDL3 may be controlled by the one first write driver WD1, and the same write voltage Vwr may be provided to a plurality of second write drivers WD2.

Figure 14:
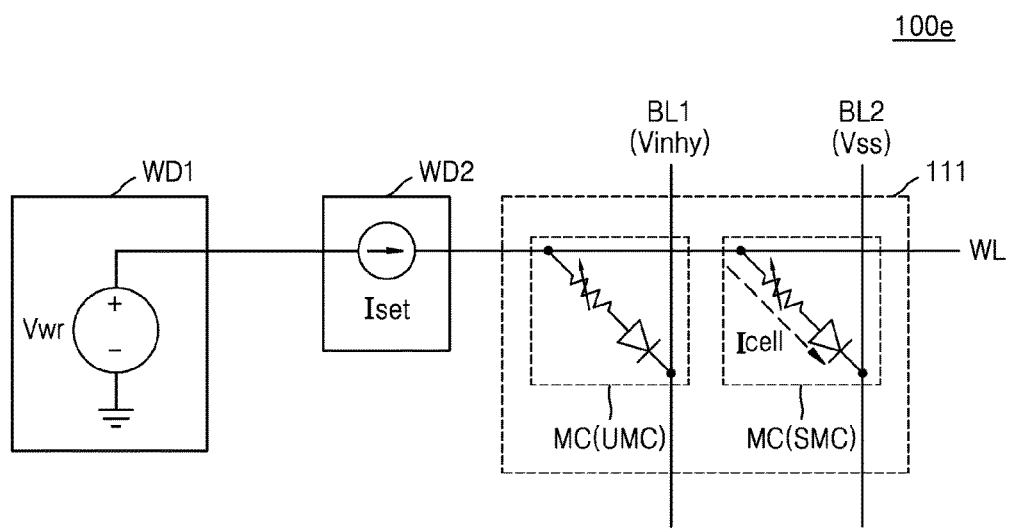
FIG. 14 is a circuit diagram illustrating an example of a memory device according to an exemplary embodiment of the present disclosure.

FIG. 14 is a circuit diagram illustrating a memory device 100e which is an example of a memory device according to an exemplary embodiment of the present disclosure.

Referring to FIG. 14, the memory device 100e may include a first memory cell array 111, a first write driver WD1, and a second write driver WD2. The memory device 100e according to the present exemplary embodiment is an exemplary embodiment of the memory device 100 of FIG. 2, and description provided with reference to FIG. 2 may also apply to the present exemplary embodiment. Also, although not shown in FIG. 14, the elements of the memory device 100 of FIG. 2 may also be included in the memory device 100e of the present exemplary embodiment.

The first memory cell array 111 may include a plurality of word lines WL, a plurality of bit lines BL1 and BL2, and a plurality of memory cells MC connected between the plurality of word lines WL and the plurality of bit lines BL1 and BL2. FIG. 14 illustrates, for convenience of description, that the first memory cell array 111 includes one word line WL and two bit lines BL1 and BL2.

The first write driver WD1 may provide a write voltage Vwr for writing data to memory cells MC. The first write driver WD1 may be a voltage driver driving the write voltage Vwr, and may provide the write voltage Vwr to second write driver WD2.

The second write driver WD2 may be arranged between the first memory cell array 111 and the first write driver WD1. The second write driver WD2 may be disposed adjacent to the first memory cell array 111, and may be connected to the word line WL of the first memory cell array 111. The second write driver WD2 may generate a write current Iset based on the write voltage Vwr received from the first write driver WD1, and may provide the write current Iset to the memory cells MC via the word line WL. The second write driver WD2 may convert the write voltage Vwr into the write current Iset. Providing the write current Iset means sinking the write current Iset output from the memory cells MC or sourcing the write current Iset input to the memory cells MC.

In a set write operation on the first memory cell array 111, one of the plurality of bit lines BL1 and BL2, here, the bit line BL2, may be selected. A ground voltage Vss may be applied to the selected bit line BL2. A column inhibit voltage Vinhy may be applied to the unselected bit line BL1. A cell current Icell may flow through a selected memory cell SMC. As a forward cell current Icell flows through the selected memory cell SMC, a set write operation in which a resistance value of the selected memory cell SMC is reduced may be performed. No current flows through an unselected memory cell UMC, and accordingly, a write current Iset received from the second write driver WD2 may flow through the selected memory cell SMC. In other words, a current amount of the cell current Icell of the selected memory cell SMC may be the same or similar as a current amount of the write current Iset.

Meanwhile, although not illustrated, the memory device 100e may further include another memory cell array, for example, a second memory cell array, and a second write driver providing the second memory array with a write current. The first write driver WD1 may provide a write voltage Vwr to the second write driver connected to the second memory cell array in a write operation on the second memory cell array. As described above, when a plurality of memory cell arrays are electrically connected to the first write driver WD1, and when a write operation is performed on one memory cell array, a parasitic capacitance component due to the other memory cell arrays may affect the cell current Icell flowing through the selected memory cell SMC. However, in the memory device 100e according to the present exemplary embodiment, the first write driver WD1 provides the write voltage Vwr, and the second write driver WD2 disposed adjacent to the first memory cell array 111 converts the write voltage Vwr received from the first write driver WD1 into the write current Iset and provides the same to the memory cells MC, thereby reducing the influence due to a parasitic capacitance. Accordingly, the cell current Icell flowing through the selected memory cell SMC may be maintained at the same or similar level as the write current Iset.

Figure 15:
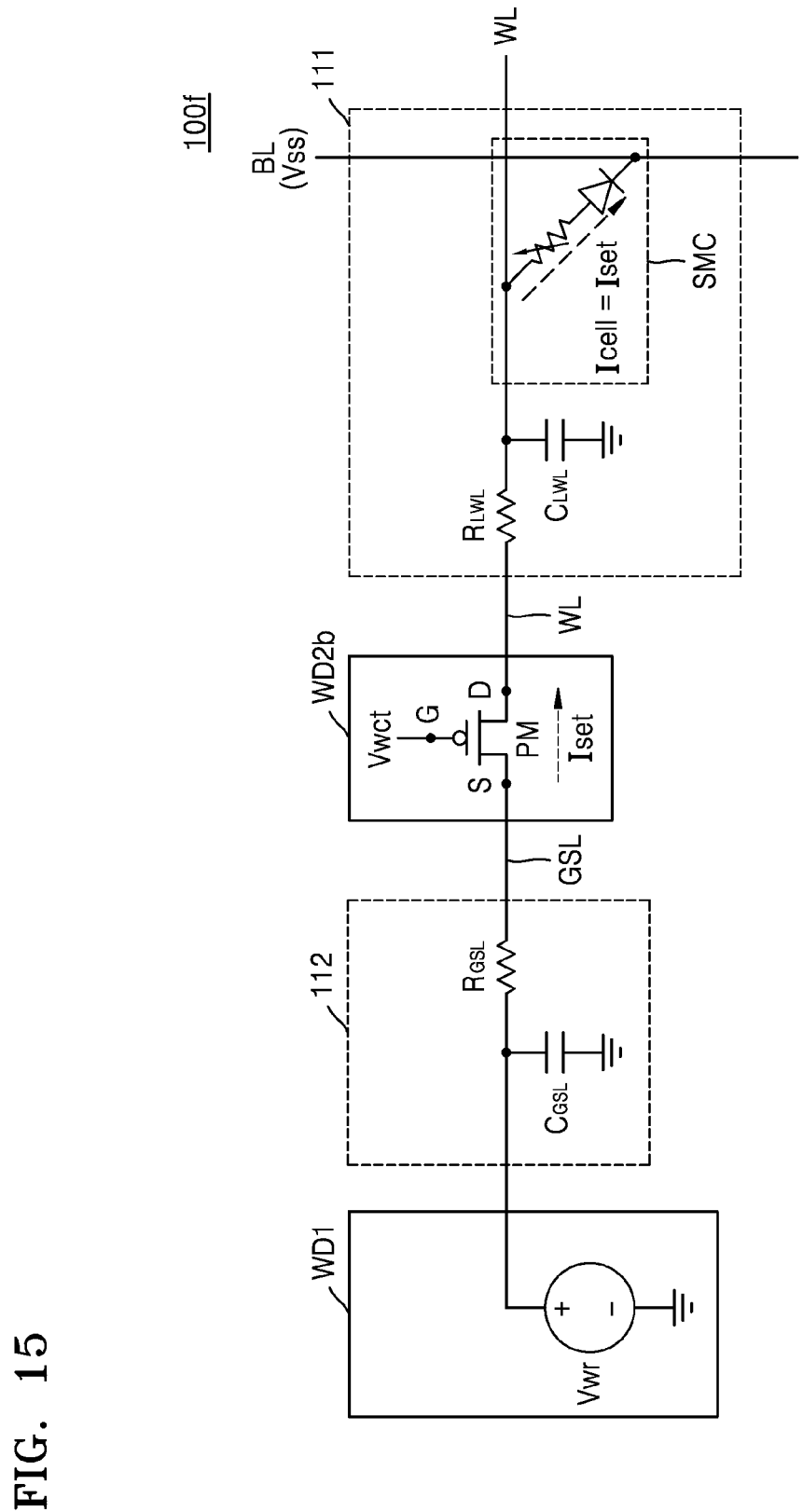
FIG. 15 is a circuit diagram of a memory device according to an exemplary embodiment of the present disclosure.

FIG. 15 is a circuit diagram of a memory device 100f according to an exemplary embodiment of the present disclosure. FIG. 15 is a detailed circuit diagram of the memory device 100e of FIG. 14, and description provided with reference to FIG. 15 may be applied to the present exemplary embodiment. Description here will focus on an embodiment in which a set write operation is performed on the selected memory cell SMC of the first memory cell array 111.

Referring to FIG. 15, the memory device 100f may include a first memory cell array 111, a second memory cell array 112, a first write driver WD1, and a second write driver WD2b.

The first memory cell array 111 may include a plurality of memory cells, and when a write operation is performed on a selected memory cell SMC, other unselected memory cells connected to the same word line WL as the selected memory cell SMC may be represented as a parasitic capacitance component, for example, as a word line capacitor $C_{LWL}$. The word line WL may include a parasitic resistance component, for example, a word line resistor $R_{LWL}$. The word line capacitor $C_{LWL}$ may be very small, and thus will not be considered here in regard to a write operation on the selected memory cell SMC.

The selected memory cell SMC of the first memory cell array 111 may be connected to the word line WL, and a first end of the second write driver WD2b may be connected to the word line WL. A second end of the second write driver WD2b may be connected to a global source line GSL. The second memory cell array 112 may be connected to the global source line GSL. The second memory cell array 112 indicates at least one memory cell array other than the first memory cell array 111. When performing a write operation on the selected memory cell SMC, the second memory cell array 112 may be represented as a parasitic component, for example, as a source line capacitor $C_{GSL}$. The source line capacitor $C_{GSL}$ may be far greater than the word line capacitor $C_{LWL}$. The global source line GSL may include a parasitic resistance component, for example, a source line resistor $R_{GSL}$.

The first write driver WD1 may be connected to the global source line GSL, and may provide the second write driver WD2b with a write voltage Vwr via the global source line GSL.

The second write driver WD2b may generate a write current Iset based on a write control voltage Vwct and the write voltage Vwr received from the first write driver WD1. As described with reference to FIG. 2, the write control voltage Vwct may be provided by the voltage generator 140 (FIG. 2). The write control voltage Vwct may have a predetermined preset voltage level. A voltage level of the write control voltage Vwct may be lower than a voltage level of the write voltage Vwr.

According to the present exemplary embodiment, the second write driver WD2b may include a second transistor PM. The second transistor PM may be a PMOS transistor. A drain D of the second transistor PM may be connected to a word line WL, and a source S thereof may be connected to the global source line GSL. The write voltage Vwr may be applied to the source S of the second transistor PM. However, when considering the source line resistor $R_{GSL}$, a voltage having a voltage level corresponding to a voltage level of the write voltage Vwr, which is decreased by a result calculated by multiplying the write current Iset by the source line resistor $R_{GSL}$, may be applied to the source S of the second transistor PM. The write control voltage Vwct may be applied to a gate G of the second transistor PM.

The second transistor PM may generate the write current Iset based on a difference between voltages of the gate G and the source S (hereinafter, the difference is referred to as a voltage Vgs. Since a voltage level of the write control voltage Vwct is uniform, the write current Iset may be varied according to a voltage level of the source S of the second transistor PM. As described above, the second write driver WD2b may generate the write current Iset based on the write voltage Vwr received from the first write driver WD1, and control a current amount of the write current Iset.

In the memory device 100f according to the present exemplary embodiment, the first write driver WD1 may provide the write voltage Vwr, and the second write driver WD2b disposed adjacent to the first memory cell array 111 may convert the write voltage Vwr received from the first write driver WD1 into the write current Iset and provide the write current Iset to the selected memory cell SMC via a word line WL. The cell current Icell flowing through the selected memory cell SMC may be the same or similar as the write current Iset.

As described above, as the current amount of the cell current Icell flowing through the selected memory cell SMC is controlled by the second write driver WD2b disposed adjacent to the first memory cell array 111 in the memory device 100f, the current amount of the cell current Icell is not affected by the source line capacitor $C_{GSL}$. Thus, a resistance value of the selected memory cell SMC may be easily adjusted to a desired resistance value.

Figure 16:
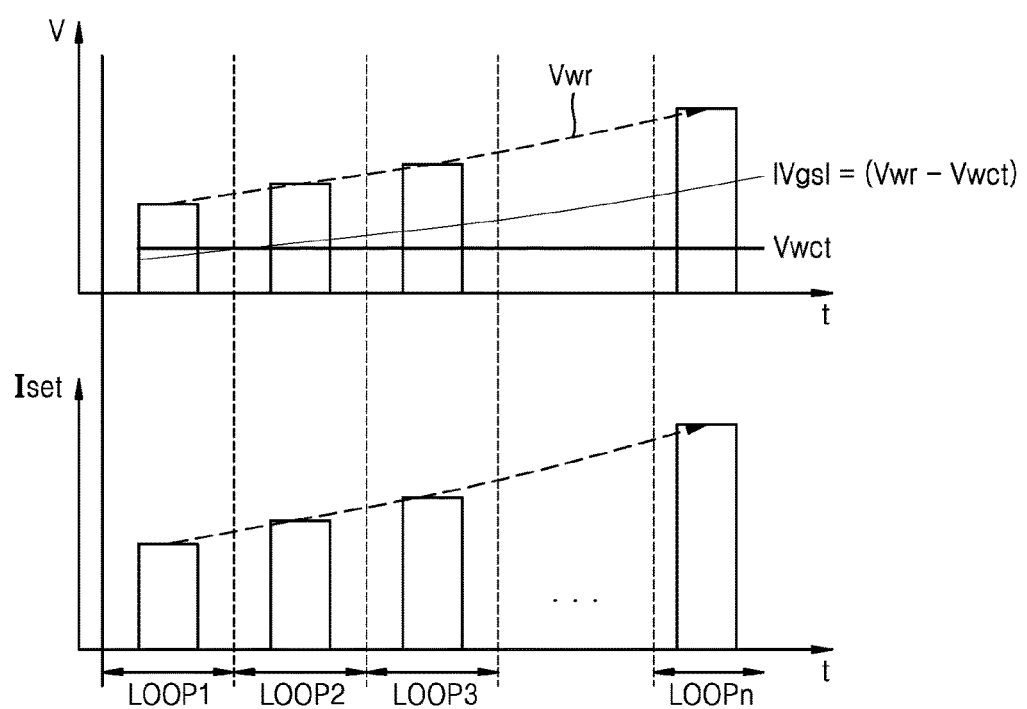
FIG. 16 is a graph showing a variation of a write voltage and a write current in the memory device of FIG. 15.

FIG. 16 is a graph showing a variation of the write voltage Vwr and the write current Iset in the memory device 100f of FIG. 15.

In order to write data by using an ISPP method, a current amount of the write current Iset may be increased as a value of a program loop increases.

Meanwhile, as described with reference to FIG. 15, the second write driver WD2b may generate a write current Iset based on a write voltage Vwr received from the first write driver WD1. Thus, by varying a voltage level of the write voltage Vwr, a current amount of the write current Iset may be varied. The current amount of the write current Iset may be approximately proportional to the voltage Vgs as described with reference to Expression 1. As an absolute value of the voltage Vgs is increased, the write current Iset may be increased.

In the memory device 100f of FIG. 15, a voltage level of the write control voltage Vwct may be uniform, and a voltage level of the write voltage Vwr may be higher than the voltage level of the write control voltage Vwct. Thus, an absolute value of Vgs may be increased by increasing the voltage level of the write voltage Vwr. Accordingly, as a value of a program loop increases, the memory device 100f (FIG. 15) according to the present exemplary embodiment may increase a current amount of the write current Iset by increasing the voltage level of the write voltage Vwr.

Figure 17A:
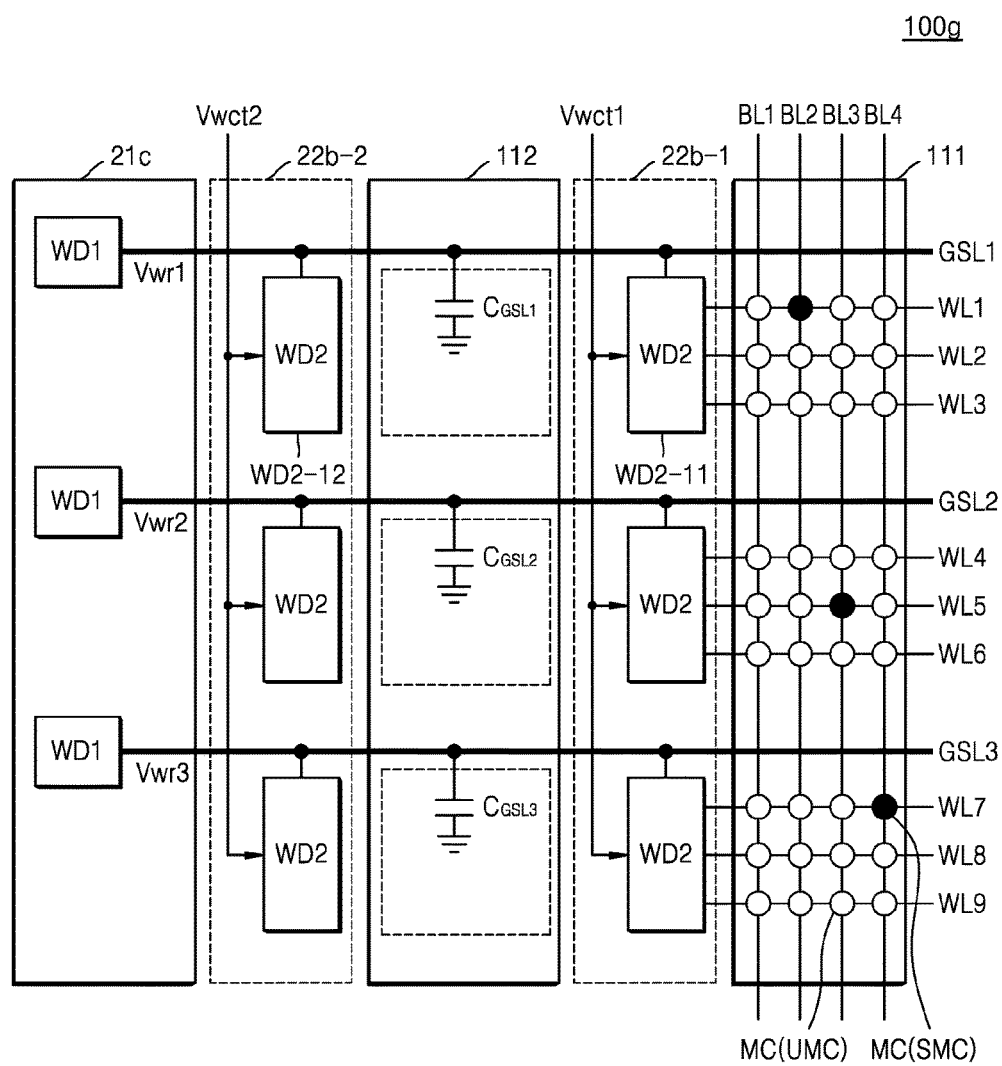
FIG. 17A is a schematic block diagram illustrating another example of a memory device according to an exemplary embodiment of the present disclosure.

FIG. 17A is a schematic block diagram illustrating a memory device 100g which is another example of a memory device according to an exemplary embodiment of the present disclosure.

Referring to FIG. 17A, the memory device 100g may include a plurality of memory cell arrays 111 and 112, a first write circuit 21c, and a plurality of second write circuits 22b-1 and 22b-2. The first write circuit 21c may include a plurality of first write drivers WD1, and the plurality of second write circuits 22b-1 and 22b-2 may each include a plurality of second write drivers WD2 connected to the plurality of memory cell arrays 111 and 112. Meanwhile, while the memory device 100g of FIG. 17A is illustrated as including two memory cell arrays 111 and 112, the exemplary embodiments of the present disclosure are not limited thereto. The memory device 100g may include three or more memory cell arrays, and a second write circuit may be connected to each of the memory cell arrays.

The first memory cell array 111 and the second memory cell array 112 may include a plurality of bit lines BL1 through BL4, a plurality of word lines WL1 through WL9, and a plurality of memory cells MC arranged in regions where the bit lines BL1 through BL4 and the word lines WL1 through WL9 cross each other. The number of bit lines and word lines included in each of the memory cell arrays 111 and 112 may be various. Hereinafter, the memory device 100g will be described with respect to a write operation on the first memory cell array 111, and thus, the second memory cell array 112 will be briefly represented as a parasitic component, for example, as source line capacitors $C_{GSL1}$, $C_{GSL2}$, and $C_{GSL3}$.

At least one of the plurality of word lines WL1 through WL9 of the first memory cell array 111 may be connected to the second write drivers WD2. For example, as illustrated in FIG. 17A, three word lines may be connected to each of the second write drivers WD2. One word line selected from among the plurality of word lines and connected to a selected memory cell SMC may be electrically connected to the second write drivers WD2 to receive a write current from the second write drivers WD2. The second write driver WD2 may generate a write current based on an applied write voltage as described with reference to FIGS. 14 and 15. The second write drivers WD2 may provide the selected memory cell SMC with the write current via a selected word line.

The plurality of second write drivers WD2 may be respectively connected to a plurality of global source lines GSL1, GSL2, and GSL3. Also, the plurality of first write drivers WD1 included in the first write circuit 21c may be respectively connected to the plurality of global source lines GSL1, GSL2, and GSL3. As described above with reference to FIGS. 14 and 15, the first write drivers WD1 may provide a write voltage. The plurality of first write drivers WD1 may provide corresponding second write drivers WD2 with a write voltage via the connected global source lines GSL1, GSL2, and GSL3.

Meanwhile, according to the present exemplary embodiment, the plurality of first write drivers WD1 may provide different write voltages Vwr1, Vwr2, and Vwr3. Selected memory cells SMC may be programmed to different resistance states, or when the selected memory cells MC are programmed from a previous resistance state to another resistance state, the changes in resistance of the selected memory cells SMC may be different from one another. In programming the selected memory cells MC, different write currents are to be applied to selected word lines, for example, to a first word line WL1, a fifth word line WL5, and a seventh word line WL7. Accordingly, the plurality of first write drivers WD1 may respectively provide different write voltages Vwr1, Vwr2, and Vwr3 to second write drivers WD2 corresponding to the first write drivers WD1, in order to generate write currents based on the write voltages. According to data written to the selected memory cells SMC, voltage levels of the write voltages Vwr1, Vwr2, and Vwr3 may be different from or the same with one another.

Meanwhile, as described with reference to FIG. 15, the second write drivers WD2 may generate a write current based on applied write control voltages Vwct1 and Vwct2 and the write voltages Vwr1, Vwr2, and Vwr3 received from the first write drivers WD1. A plurality of second write drivers WD2 connected to the same memory cell array may receive a same write control voltage. For example, a first write control voltage Vwct1 may be applied to a plurality of second write drivers WD2 connected to the first memory cell array 111.

According to an exemplary embodiment, different write control voltages may be applied to second write drivers WD2 that are respectively connected to different memory cell arrays. For example, a first write control voltage Vwct1 may be applied to a plurality of second write drivers WD2 connected to the first memory cell array 111, and a second write control voltage Vwct2 may be applied to a plurality of second write drivers WD2 connected to the second memory cell array 112.

Voltage levels of the first write control voltages Vwct1 and the second write control voltage Vwct2 may be different from each other, and may vary according to a distance between the first write driver WD1 and the second write driver WD2. A voltage level of the first write control voltage Vwct1 provided to the second write driver WD2 away from the first write driver WD1 may be set to be higher than a voltage level of the second write control voltage Vwct2.

Figure 17B:
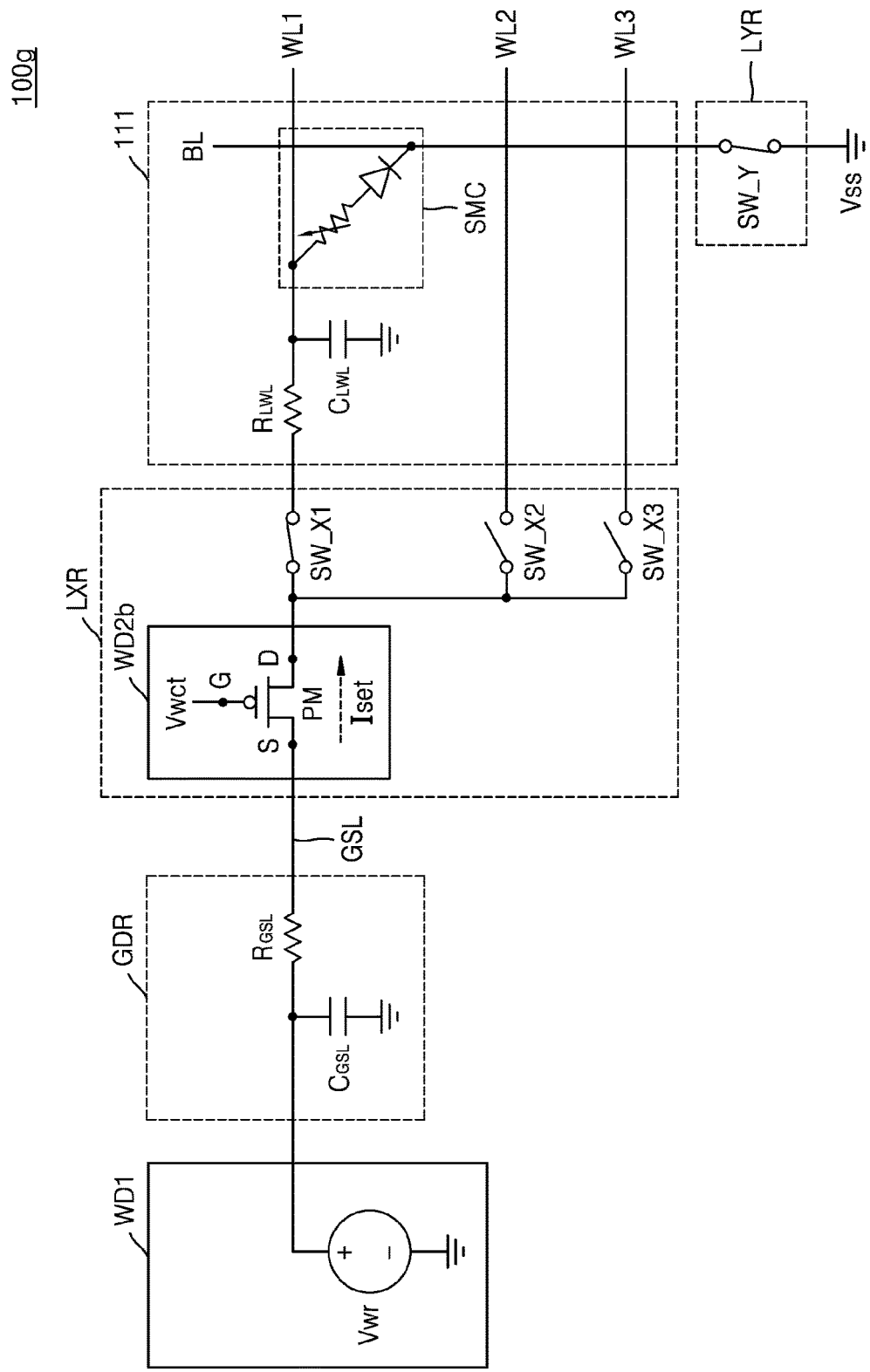
FIG. 17B is a detailed circuit diagram of the memory device of FIG. 17A.

FIG. 17B is a detailed circuit diagram of the memory device 100g of FIG. 17A.

Referring to FIG. 17B, the memory device 100g may include the first memory cell array 111, a local column region LYR, a local row region LXR, a global data line region GDR, and the first write driver WD1.

The first memory cell array 111 is described above with reference to FIG. 17A, and thus repeated description will be omitted.

The global source line region GDR may generally refer to a region where a global source line GSL and other memory cell arrays connected to the global source line GSL, for example, the second memory cell array 112 of FIG. 17A, are arranged. The other memory cell arrays arranged in the global source line region GDR will be modeled as a source line capacitor labeled $C_{GSL}$.

The local column region LYR may include a column switch SW_Y providing a ground voltage Vss to a bit line BL. The local column region LYR may be, for example, a column decoder. While FIG. 17B illustrates one column switch SW_Y for convenience of description, a plurality of column switches SW_Y may be connected to a plurality of bit lines of the first memory cell array 111 to provide a ground voltage Vss to a selected bit line.

The local row region LXR may include row switches SW_X1, SW_X2, and SW_X3 selecting a word line WL and a second write driver WD2b. The local row region LXR may be, for example, a row decoder. The row switches SW_X1, SW_X2, and SW_X3 may be respectively connected to a plurality of word lines WL1 through WL3 so as to electrically connect the plurality of word lines WL1 through WL3 to the second write driver WD2b. One of the row switches SW_X1, SW_X2, and SW_X3 may be turned on to connect a selected word line to the second write driver WD2b. Thus, the second write driver WD2b may generate a write current Iset based on a write voltage Vwr received from the first write driver WD1, and may provide the write current Iset to a selected word line, for example, the first word line WL1.

Figure 18:
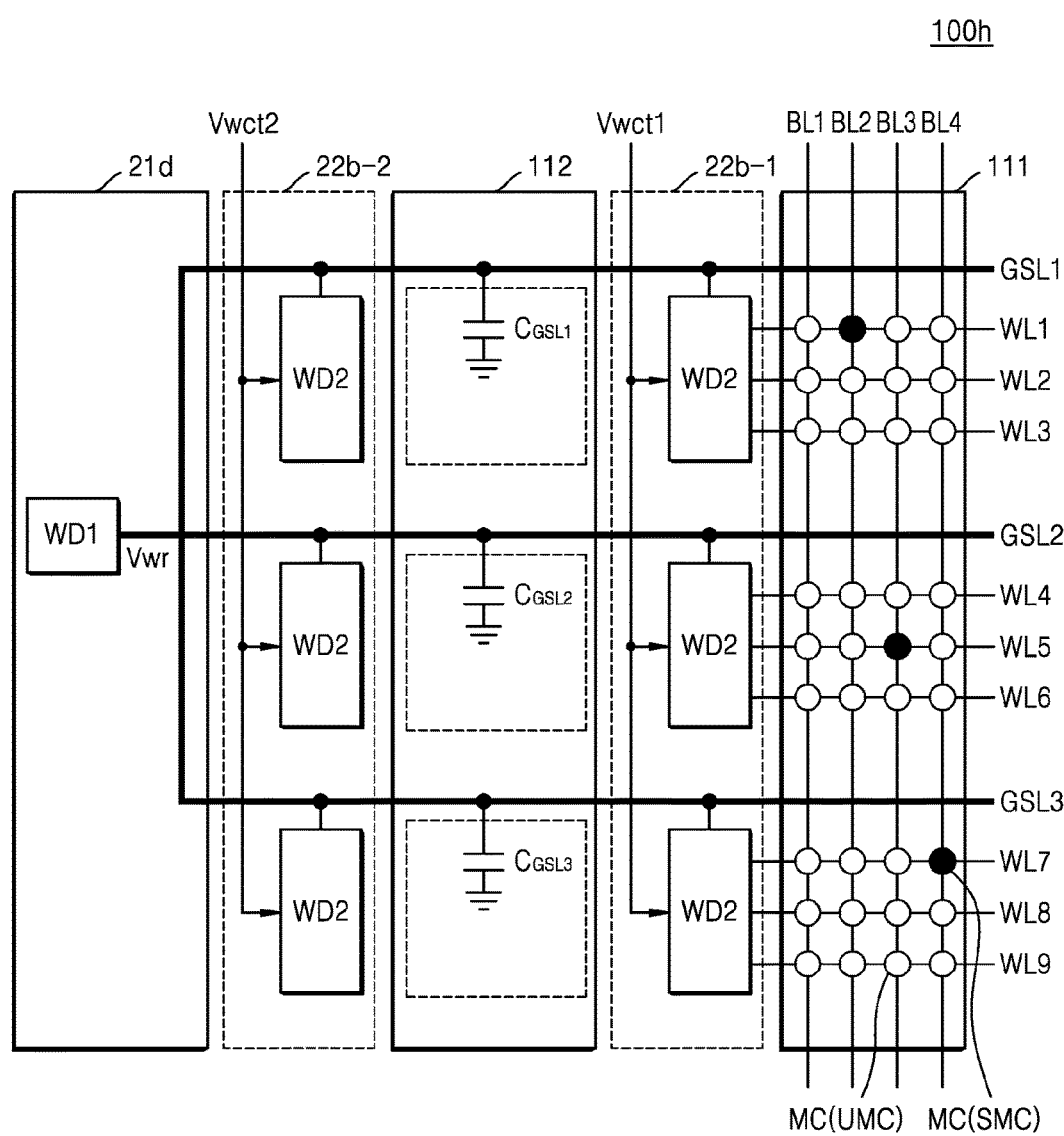
FIG. 18 is a block diagram illustrating a memory device according to an exemplary embodiment of the present disclosure.

FIG. 18 is a block diagram illustrating a memory device 100h according to an exemplary embodiment of the present disclosure.

The memory device 100h according to the present exemplary embodiment is similar to the memory device 100g of FIG. 17A. However, in the memory device 100h of the present exemplary embodiment, unlike the memory device 100g of FIG. 17A, a plurality of global source lines GSL1, GSL2, and GSL3 may be connected to one first write driver WD1. Thus, the plurality of global source lines GSL1, GSL2, and GSL3 may be controlled by the one first write driver WD1, and a same write voltage Vwr may be provided to a plurality of second write drivers WD2.

Figure 19:
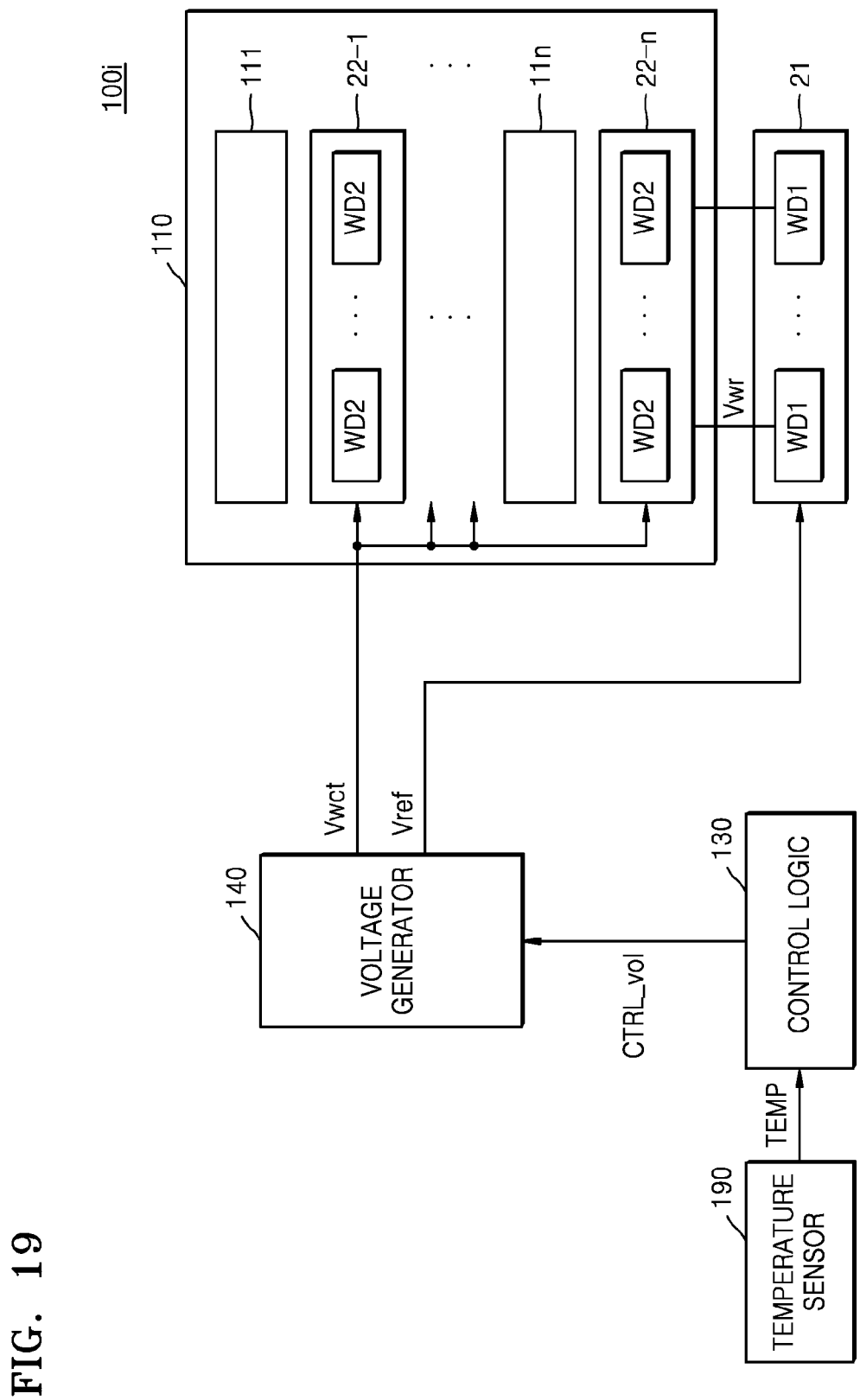
FIG. 19 is a block diagram illustrating a memory device according to an exemplary embodiment of the present disclosure.

FIG. 19 is a block diagram illustrating a memory device 100i according to an exemplary embodiment of the present disclosure.

Referring to FIG. 19, the memory device 100i may include a memory cell array 110, a control logic 130, a voltage generator 140, a first write circuit 21, and a plurality of second write circuits 22-1 through 22-n. The memory device 100i according to the present exemplary embodiment is an exemplary embodiment of the memory device 100 of FIG. 2, and the description provided with reference to FIG. 2 may also apply to the present exemplary embodiment. Also, although not shown in FIG. 19, the elements of the memory device 100 of FIG. 2 may also be included in the memory device 100i of the present exemplary embodiment.

The memory cell array 110 may include first through nth memory cell arrays 111 through 11n, and corresponding second write circuits among the plurality of second write circuits 22-1 through 22-n may be respectively connected to the first through nth memory cell arrays 111 through 11n. The plurality of second write circuits 22-1 through 22-n may each include a plurality of second write drivers WD2. The second write drivers WD2 may be connected to a bit line or a word line of the memory cell array 110. The second write driver WD2 may generate a write current based on a write control voltage Vwct and a write voltage Vwr received from a corresponding first write driver WD1, and may provide the write current to a memory cell via a connected bit line or a connected word line.

The first write circuit 21 may include a plurality of first write drivers WD1. Each of the plurality of first write drivers WD1 may provide the write voltage Vwr to the second write driver WD2 to which each first write driver WD1 corresponds.

The voltage generator 140 may generate the write control voltage Vwct to be provided to the second write driver WD2, and provide the write control voltage Vwct to the second write driver WD2. According to an exemplary embodiment, the voltage generator 140 may generate a plurality of write control voltages Vwct having different voltage levels, and provide the plurality of write control voltages Vwct to the plurality of second write circuits 22-1 through 22-n, respectively.

The voltage generator 140 may also generate a reference voltage Vref and provide the reference voltage Vref to the first write circuit 21. A plurality of first write circuits 21 may generate a write voltage Vwr based on the reference voltage Vref to provide the write voltage Vwr to a second write driver WD2 to which each first write driver WD1 corresponds. According to an exemplary embodiment, the reference voltage Vref may be the same as the write voltage Vwr.

The voltage generator 140 may generate the write control voltage Vwct and the reference voltage Vref based on a voltage control signal CTRL_vol received from the control logic 130. The control logic 130 may determine a control signal CTRL_vol received from the memory controller 200 (FIG. 1) or a write situation with respect to the memory device 100i, and may adjust a voltage level of the write control voltage Vwct or the reference voltage Vref based on a determining result.

According to an exemplary embodiment, the memory device 100i may further include a temperature sensor 190. The temperature sensor 190 may sense an internal or external temperature, and provide the control logic 130 with sensed temperature information TEMP. The control logic 130 may adjust a voltage level of the write control voltage Vwct or the reference voltage Vref based on the temperature information TEMP.

For example, when a temperature is relatively high, a movement speed of electrons may be increased. Accordingly, a write current received from the second write driver WD2 may be increased. The control logic 130 may adjust a voltage level of the write control voltage Vwct based on the temperature information TEMP to thereby maintain a uniform write current received from the second write driver WD2, regardless of temperature.

Meanwhile, while the temperature sensor 190 is illustrated as being included inside the memory device 100i in FIG. 19, the exemplary embodiments are not limited thereto. The temperature sensor 190 may also be included outside the memory device 100i, for example, in the memory controller 200 (FIG. 1). The memory controller 200 may provide the control logic 130 with temperature information TEMP as a control signal CTRL.

Figure 20:
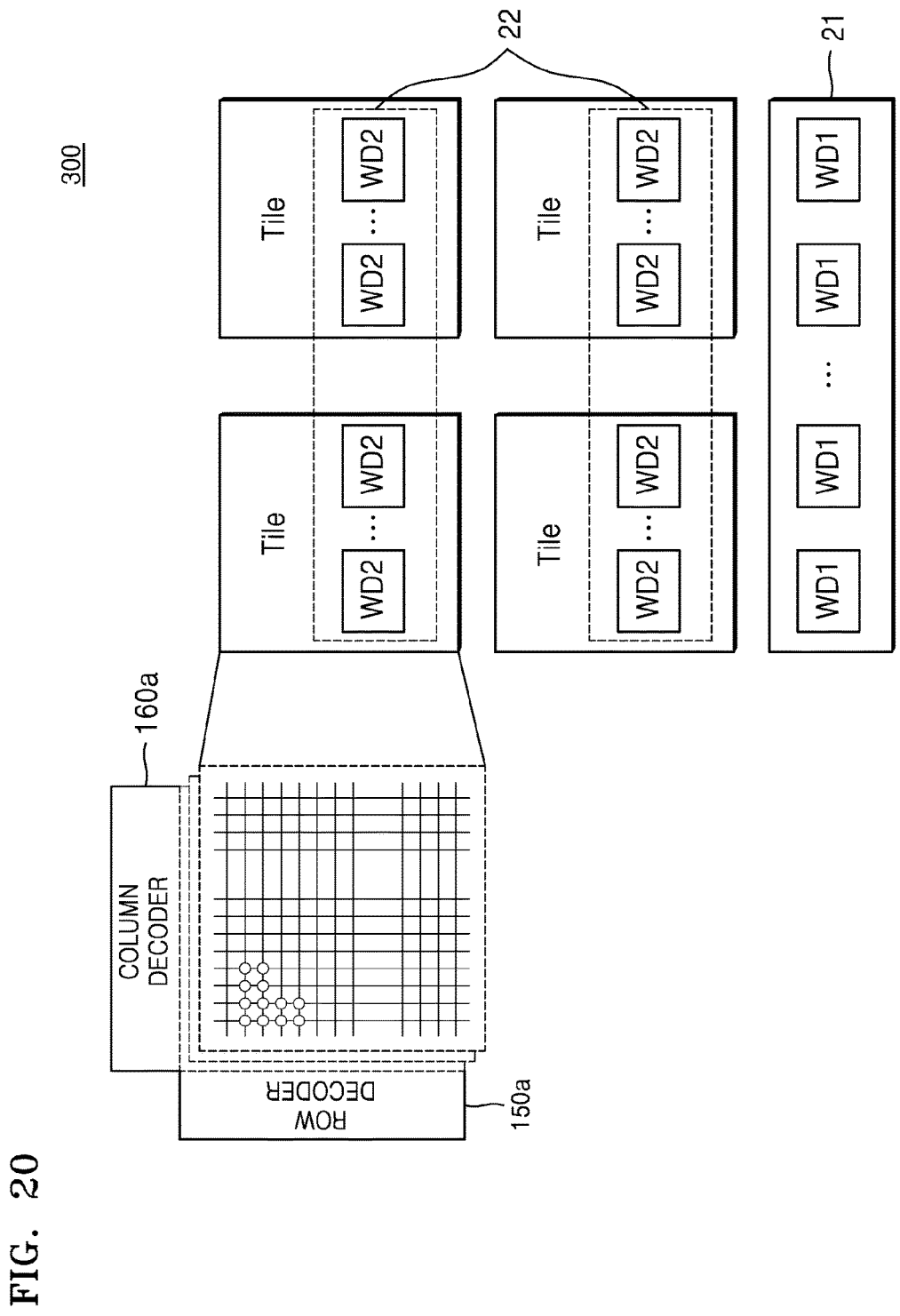
FIG. 20 illustrates an example of a memory device according to an exemplary embodiment of the present disclosure.

FIG. 20 illustrates an example of a memory device 300 according to an exemplary embodiment of the present disclosure.

Referring to FIG. 20, the memory device 300 may include a plurality of tiles, a first write circuit 21, and a second write circuit 22.

A tile may be defined as a memory cell array including a plurality of word lines and a plurality of bit lines connected to one row decoder and one column decoder. The plurality of tiles may share a plurality of first write drivers WD1 included in the first write circuit 21, and each tile may be connected to a plurality of second write drivers WD2. According to an exemplary embodiment, the plurality of second write drivers WD2 may be implemented as a portion of a row decoder 150a or a column decoder 160a connected to each tile.

As described above with reference to FIGS. 8 through 18, the first write driver WD1 may be a voltage driver, and the second write driver WD2 may be a current driver. The first write driver WD1 may provide a write voltage to a second write driver WD2 to which the first write driver WD1 corresponds, and the second write driver WD2 may generate a write current based on the write voltage received from the first write driver WD1 to which the second write driver WD2 corresponds and provide the write current to a memory cell.

Meanwhile, as illustrated in FIG. 20, a memory cell array of each tile may include memory cells that are stacked in a vertical direction. Memory cells arranged at same locations along a vertical direction may form one memory cell layer. According to an exemplary embodiment, each of the second write drivers WD2 connected to a tile may provide a write current to a plurality of memory cell layers. In other words, the plurality of memory cell layers share the plurality of second write drivers WD2, and a write operation on the plurality of memory cell layers may be commonly controlled by the plurality of second write drivers WD2. According to another exemplary embodiment, the plurality of second write drivers WD2 may provide different memory cell layers with a write current. In other words, the plurality of memory cell layers are respectively connected to the plurality of different second write drivers WD2, and a write operation on each memory cell layer may be individually controlled by the plurality of different second write drivers WD2.

Figure 21A:
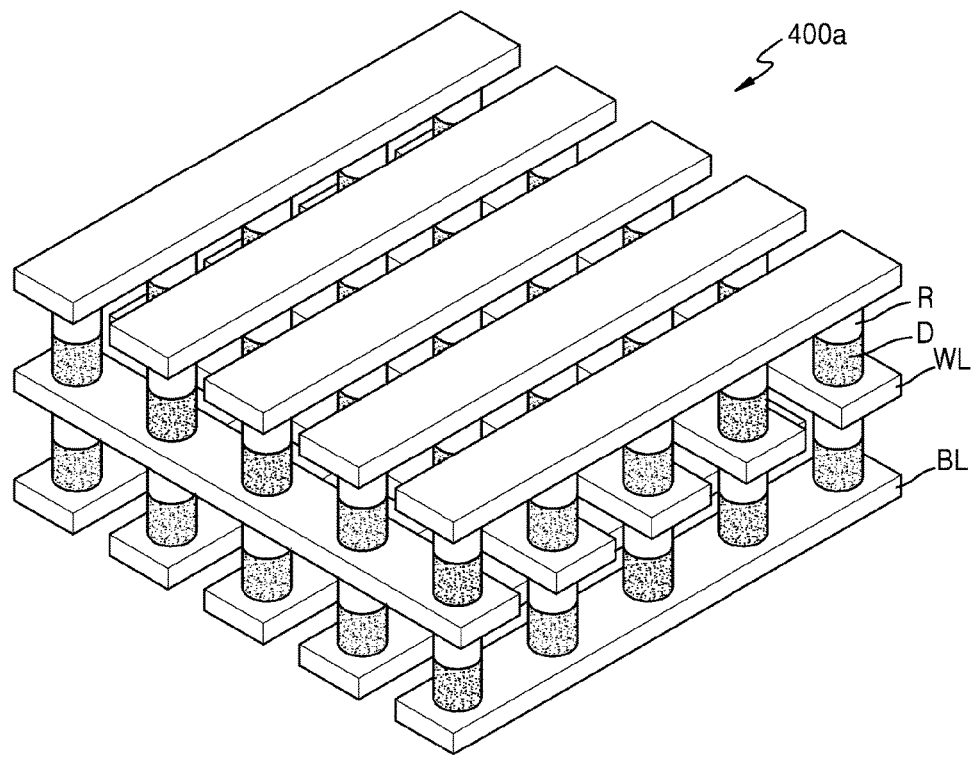
FIGS. 21A and 21B are perspective views illustrating examples of the memory device of FIG. 1.
Figure 21B:
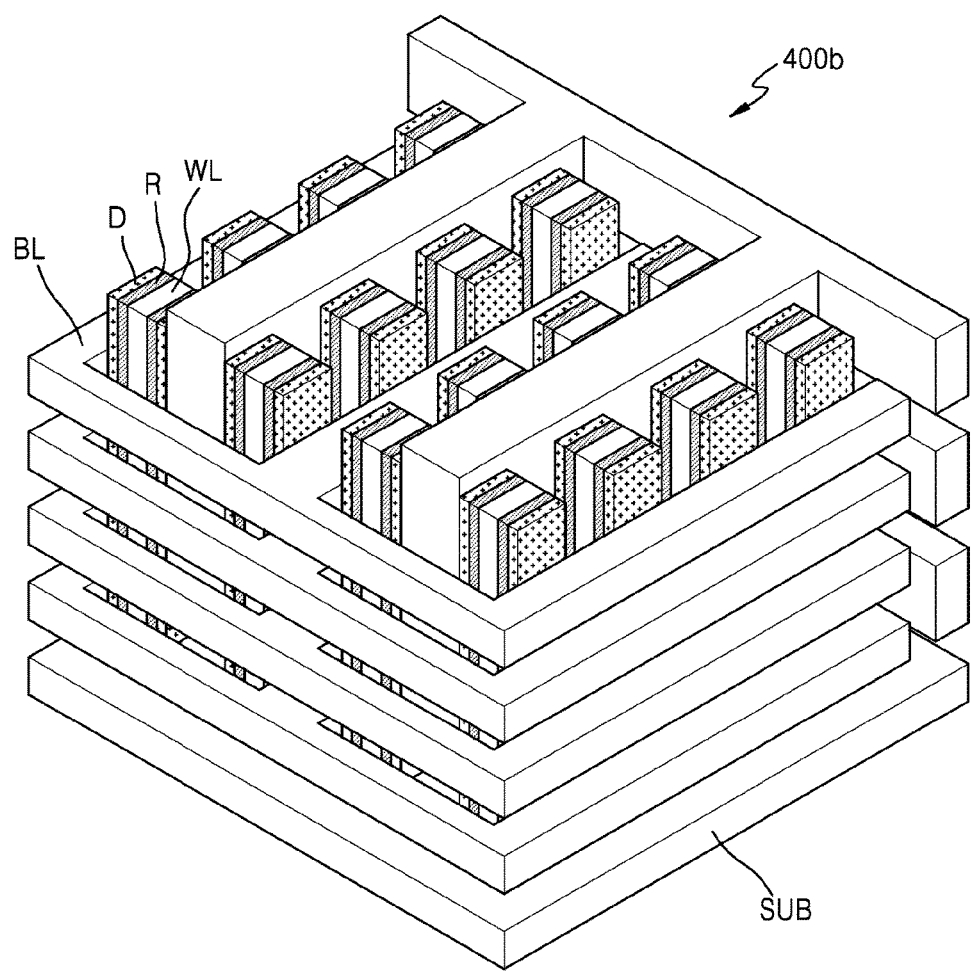

FIGS. 21A and 21B are perspective views illustrating examples of the memory device 100 of FIG. 1.

Referring to FIG. 21A, a memory device 400a may include a plurality of bit lines BL, a plurality of word lines WL and a plurality of memory cells. The plurality of bit lines BL may be disposed to cross the plurality of word lines WL. The plurality of memory cells may be respectively disposed in regions where the plurality of bit lines BL and the plurality of word lines WL cross each other, and may include a diode D and a variable resistance device R. As illustrated in FIG. 21A, the plurality of memory cells may be stacked in a vertical direction.

According to an exemplary embodiment, a peripheral circuit driving the memory cells (for example, a row decoder, a column decoder, a write circuit, a read circuit or the like) may be formed under the stacked memory cells. According to another exemplary embodiment, the peripheral circuit may be formed in a different region from a region where the memory cells are formed.

Referring to FIG. 21B, a memory device 400b may include a plurality of bit lines BL disposed in parallel to a substrate SUB, a plurality of word lines WL disposed in a vertical direction to the substrate SUB, and a plurality of memory cells respectively disposed between the bit lines BL and the word lines WL. Each memory cell may include a diode material D and a variable resistance material R formed in a vertical direction to the substrate SUB. The variable resistance material R may be, for example, an amorphous silicon doped with V, Co, Ni, Pd, Fe or Mn, or may be perovskite materials such as Pr1-xCaxMnO3, La1-xCax-MnO3(LCMO), LaSrMnO3(LSMO), or GdBaCoxOy (GBCO).

Figure 22:
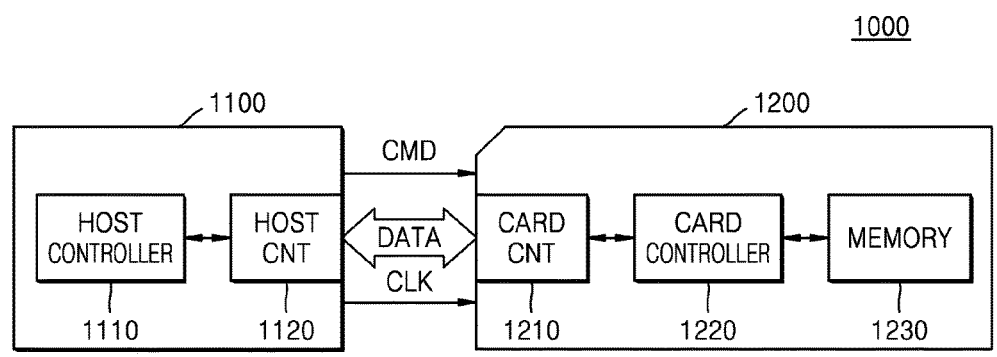
FIG. 22 is a block diagram of a memory card system including a memory system according to exemplary embodiments of the present disclosure, applied thereto.

FIG. 22 is a block diagram of a memory card system 1000 including a memory system according to exemplary embodiments of the present disclosure, applied thereto.

Referring to FIG. 22, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory device 1230 may be the memory devices according to the exemplary embodiments of the present disclosure. The memory device 1230 may include a memory cell array, a first write driver providing a write voltage, and a second write driver that is disposed between the memory cell array and the first write driver and converts a voltage received from the first write driver into a write current during a set write operation and provides the write current to the memory cell array. As the second write driver is disposed adjacent to the memory cell array to control the write current to flow through a selected memory cell, an unexpected surge current may be prevented from flowing through the memory cell due to a parasitic capacitance component. Thus, as a write disturbance due to the surge current is prevented, reliability of the memory device 1230 may be increased.

The host 1100 may write data to the memory card 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a Microdrive, a Smart Media Card (SMC), a Multimedia Card (MMC), a Security Digital Card (SDC), a memory stick, or a USB flash memory drive or the like.

Figure 23:
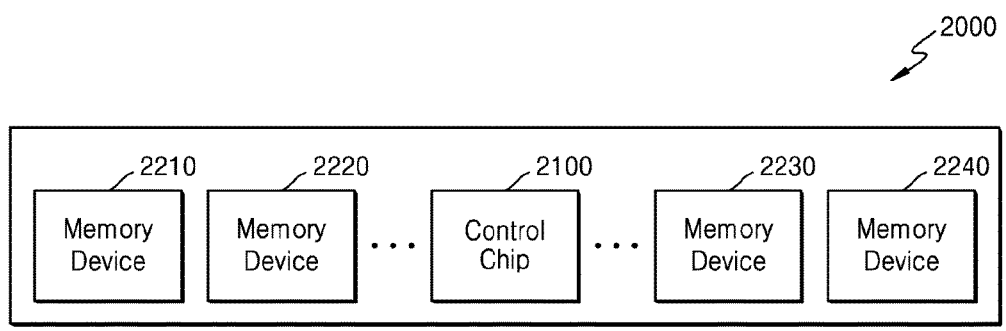
FIG. 23 illustrates a resistive memory module according to an exemplary embodiment of the present disclosure.

FIG. 23 illustrates a resistive memory module according to an exemplary embodiment of the present disclosure. Referring to FIG. 23, a memory module 2000 may include memory devices 2210 through 2240 and a control chip 2100. The memory devices 2210 through 2240 may be the memory devices according to the exemplary embodiments of the present disclosure described above with reference to FIGS. 2 through 18. Each of the memory devices 2210 through 2240 may include a memory cell array, a first write driver providing a write voltage, and a second write driver that is disposed between the memory cell array and the first write driver and converts a voltage received from the first write driver into a write current during a set write operation and provides the write current to the memory cell array. As the second write driver is disposed adjacent to the memory cell array to control the write current to flow through a selected memory cell, an unexpected surge current may be prevented from flowing through the memory cell due to a parasitic capacitance component. Thus, as a write disturbance due to the surge current is prevented, reliability of the memory device 1230 may be increased.

The control chip 2100 may control the memory devices 2210 through 2240 in response to various signals transmitted from an external memory controller. For example, the control chip 2100 may activate the memory devices 2210 through 2240 according to various commands and addresses transmitted from the outside, to thereby control write and read operations. Also, the control chip 2100 may perform various post-processings on read data output from each of the memory devices 2210 through 2240, and may, for example, perform error detection and correction on the read data.

Figure 24:
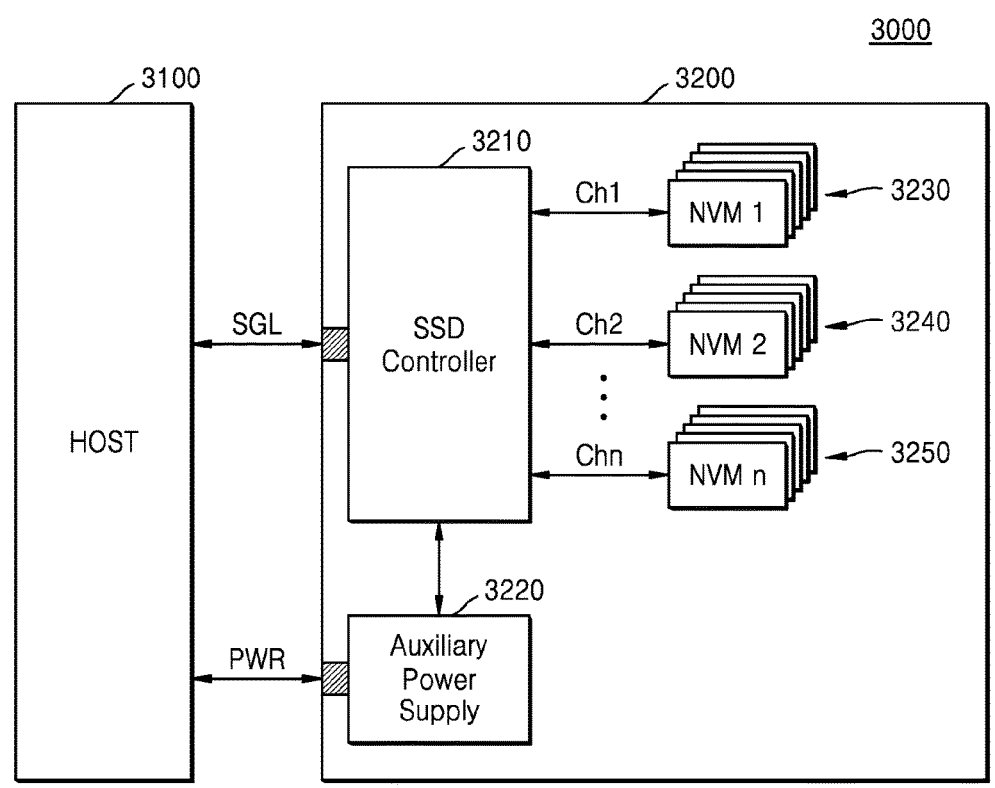
FIG. 24 is a block diagram of a solid state disk (SSD) system including a memory system applied thereto, according to an exemplary embodiment of the present disclosure.

FIG. 24 is a block diagram of a solid state disk (SSD) system 3000 including a memory system applied thereto, according to an exemplary embodiment of the present disclosure.

Referring to FIG. 24, the SSD system 3000 may include a host 3100 and an SSD 3200. The SSD 3200 exchanges signals SGL with the host 3100 via a signal connector, and may receive a power input PWR from a power connector. The SSD 3200 may include an SSD controller 3210, an auxiliary power device 3220, and a plurality of memory devices 3230, 3240, and 3250. The plurality of memory devices 3230, 3240, and 3250 may be implemented based on the memory devices according to the exemplary embodiments of the present disclosure described with reference to FIGS. 2 through 18. As a write disturbance of the plurality of memory devices 3230, 3240, and 3250 is prevented to thereby increase data reliability of the plurality of memory devices 3230, 3240, and 3250, the time required for correcting error of data read from the plurality of memory devices 3230, 3240, and 3250 may be reduced. Accordingly, performance of the SSD system 3000 may be increased.

Figure 25:
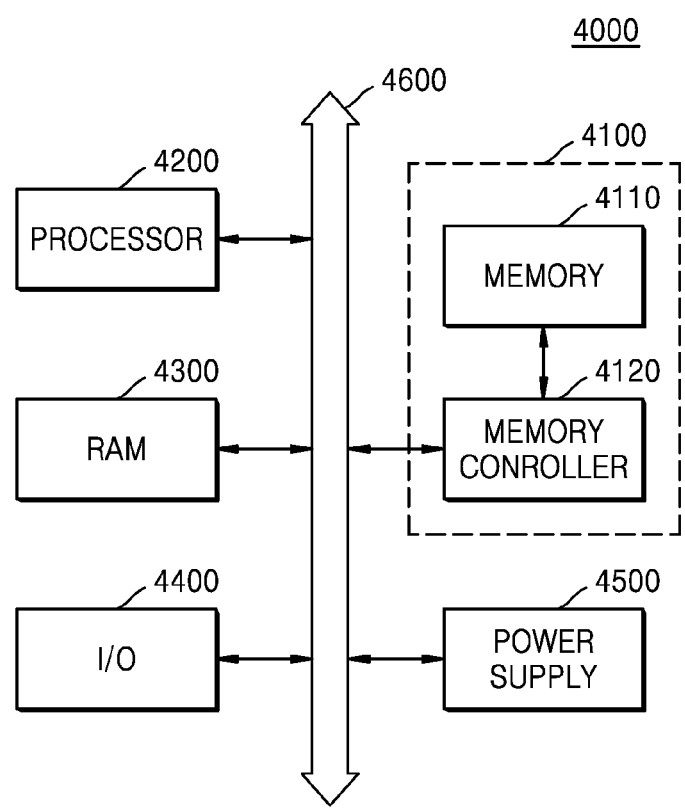
FIG. 25 is a block diagram of a computing system including the memory system according to the exemplary embodiments of the present disclosure.

FIG. 25 is a block diagram of a computing system 4000 including a memory system according to exemplary embodiments of the present disclosure.

Referring to FIG. 25, the computing system 4000 may include a memory system 4100, a processor 4200, a RAM 4300, an input/output (I/O) device 4400, and a power supply device 4500. Although not illustrated in FIG. 25, the computing system 4000 may further include ports capable of communicating with a video card, a sound card, a memory card, a USB device, or other electronic devices. The computing system 4000 may be embodied as a PC, or a portable electronic device such as a notebook computer, a mobile phone, a personal digital assistant (PDA), or a camera.

The memory system 4100 may include a memory device 4110 and a memory controller 4120. The memory system 4100 may be the memory system 10 according to the exemplary embodiment of the present disclosure described with reference to FIG. 1. The memory device 4110 may be one of the memory devices according to the various exemplary embodiments of the present disclosure described with reference to FIGS. 2 through 18. The memory device 4110 may increase data reliability by preventing an excessive surge current from flowing to a memory cell during a set write operation.

The processor 4200 may perform particular calculations or tasks. In one or more exemplary embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. According to an exemplary embodiment, the processor 4200 may also be connected to an extension bus such as a Peripheral Component Interconnect (PCI) bus.

The RAM 4300 may store data for operations of the computing system 4000. For example, a DRAM, a mobile DRAM, an SRAM, a PRAM, an FRAM, an RRAM, and/or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to exemplary embodiments thereof, it will be understood that various changes in form and details may be made therein without departing from the spirit and scope of the following claims.

What is claimed is:

1. A resistive memory device comprising:
   a memory cell array including a plurality of memory cells respectively connected to a plurality of first signal lines and a plurality of second signal lines crossing each other;
   a first write driver configured to provide a write voltage for writing data to the memory cells; and
   a second write driver disposed between the memory cell array and the first write driver and configured to provide a write current generated based on the write voltage to a first signal line selected from among the plurality of first signal lines.

2. The resistive memory device of claim 1, wherein:
   the first write driver provides the write voltage to the second write driver, and
   a voltage level of the write voltage changes according to the number of times a program loop is performed.

3. The resistive memory device of claim 1, wherein the second write driver converts the write voltage received from the first write driver into the write current.

4. The resistive memory device of claim 1, wherein:
   the second write driver includes a transistor including a drain terminal connected to the selected first signal line, a source terminal connected to the first write driver, and a gate terminal to which a control voltage is applied, and
   the transistor generates the write current based on a difference between voltages at the gate terminal and the source terminal.

5. The resistive memory device of claim 1, wherein:
   the first write driver increases or reduces the write voltage as the number of times a program loop is performed increases, and
   the write current increases as the number of times of the program loop is increased.

6. The resistive memory device of claim 1, wherein:
   the first write driver is connected to a third signal line, and the second write driver is electrically connected to the first write driver via the third signal line.

7. The resistive memory device of claim 6, wherein first signal lines, among the plurality of first signal lines, other than the selected first signal line are electrically connected to the third signal line.

8. The resistive memory device of claim 1, wherein:
   each of the plurality of memory cells includes a variable resistance device connected between one of the plurality of first signal lines and one of the plurality of second signal lines, and
   a resistance of the variable resistance device changes according to a write current provided via the corresponding first signal line.

9. A resistive memory device comprising:
   a first memory cell array and a second memory cell array each including a plurality of first signal lines, a plurality of second signal lines, and a plurality of memory cells connected to the plurality of first signal lines and the plurality of second signal lines, wherein the first memory cell array and the second memory cell array are arranged in parallel to each other;
   a first current driver configured to be connected to at least one of the plurality of first signal lines of the first memory cell array;
   a second current driver configured to be connected to at least one of the plurality of first signal lines of the second memory cell array; and
   a first voltage driver configured to provide a first write voltage to the first current driver and the second current driver via a third signal line.

10. The resistive memory device of claim 9, wherein each of the first current driver and the second current driver generate a first write current based on the first write voltage and provide the first write current to a selected memory cell of the corresponding memory cell array via the at least one of the first signal lines.

11. The resistive memory device of claim 9, wherein:
    the first current driver is disposed adjacent to the first memory cell array, and
    the second current driver is disposed adjacent to the second memory cell array.

12. The resistive memory device of claim 9, wherein in a write operation, the first voltage driver changes a voltage level of the first write voltage according to the number of times a program loop is performed.

13. The resistive memory device of claim 9, further comprising:
a third current driver configured to be connected to at least one other first signal line among the plurality of first signal lines of the first memory cell array;
a fourth current driver configured to be connected to at least one other first signal line among the plurality of first signal lines of the second memory cell array; and
a second voltage driver configured to provide a second write voltage to the third current driver and the fourth current driver via a fourth signal line.

14. The resistive memory device of claim 13, wherein:
the first current driver generates a first write current based on a voltage difference between a first control voltage set to a preset voltage and the first write voltage, and provides the first write current to the at least one first signal line of the first memory cell array, and
the third current driver generates a second write current based on a voltage difference between the first control voltage and the second write voltage, and provides the second write current to the at least one other first signal line of the first memory cell array.

15. The resistive memory device of claim 13, wherein:
the second current driver generates a third write current based on a voltage difference between a second control voltage set to a preset voltage and the first write voltage, and
the fourth current driver generates a fourth write current based on a voltage difference between the second control voltage and the second write voltage.

16. A resistive memory device comprising:
a first memory cell array having a plurality of first resistive-memory cells that are addressed by first address lines and second address lines;
a voltage driver that generates a first write voltage, the first write voltage being applied to a selected one of the first address lines during a first reset-write operation so as to program, to a higher-resistance state, a selected one of the first resistive-memory cells addressed by the selected first address line;
a first current driver that generates a first write current based upon a second write voltage generated by the voltage driver, the first write current being applied to the selected first address line during a first set-write operation so as to program, to a lower-resistance state, the selected first resistive-memory cell.

17. The resistive memory device of claim 16, further comprising:
a second memory cell array having a plurality of second resistive-memory cells that are addressed by third address lines;
a second current driver that generates a second write current based upon the second write voltage generated by the voltage driver, the second write current being applied to a selected one of the third address lines during a second set-write operation so as to program, to the lower-resistance state, a selected one of the second resistive-memory cells that is addressed by the selected third address line, wherein
the voltage driver generates a third write voltage, the third write voltage being applied to the selected third address line during a second reset-write operation so as to program, to the higher-resistance state, the selected second resistive-memory cell addressed by the selected third address line.

18. The resistive memory device of claim 17, wherein the second resistive-memory cells are addressed by the second address lines and the third address lines.

19. The resistive memory device of claim 16, further comprising:
a switch that selectively switches to electrically connect to each of the first address lines, exclusive of an electrical connection to all other of the first address lines at a particular time, wherein
the first current driver generates a second write current based upon a third write voltage generated by the voltage driver, the second write current being applied to another selected first address line, among the first address lines, during a second set-write operation so as to program, to the lower-resistance state, the other selected first resistive-memory cell.

20. The resistive memory device of claim 16, wherein the amount of the first write current generated by the first current driver is determined by a difference between a voltage signal received by the first current driver and the second write voltage generated by the voltage driver.

* * * * *